(12) United States Patent
Wu

(10) Patent No.: US 12,588,497 B2
(45) Date of Patent: Mar. 24, 2026

(54) MEMORY DEVICE

(71) Applicant: MACRONIX International Co., Ltd.,
Hsinchu (TW)

(72) Inventor: Meng-Yen Wu, Taichung City (TW)

(73) Assignee: MACRONIX International Co., Ltd.,
Hsinchu (TW)

( * ) Notice: Subject to any disclaimer, the term of this
patent is extended or adjusted under 35
U.S.C. 154(b) by 424 days.

(21) Appl. No.: 18/323,418

(22) Filed: May 25, 2023

(65) Prior Publication Data

US 2024/0395706 A1 Nov. 28, 2024

(51) Int. Cl.
| | |
|---|---|
| *H01L 23/528* | (2006.01) |
| *G11C 5/06* | (2006.01) |
| *H01L 23/522* | (2006.01) |
| *H01L 25/065* | (2023.01) |
| *H10B 41/10* | (2023.01) |
| *H10B 41/27* | (2023.01) |
| *H10B 43/10* | (2023.01) |

(Continued)

(52) U.S. Cl.
CPC .......... *H01L 23/5283* (2013.01); *G11C 5/063*
(2013.01); *H01L 23/5226* (2013.01); *H01L
25/0657* (2013.01); *H10B 41/10* (2023.02);
*H10B 41/27* (2023.02); *H10B 43/10*
(2023.02); *H10B 43/27* (2023.02); *H10B
80/00* (2023.02); *H01L 2225/06541* (2013.01)

(58) Field of Classification Search
CPC .............. H10B 20/40–65; H10B 53/20; H10B
41/20–27; H10B 43/20–27; H10B 51/20;
H10B 63/84–845; H01L 25/0657; H01L 25/0652; H01L 25/043; H01L 25/071;
H01L 25/074; H01L 25/0756; H01L
25/112; H01L 25/117; H01L 2224/08145;
H01L 27/0688; G11C 5/063
See application file for complete search history.

(56) References Cited

U.S. PATENT DOCUMENTS

2022/0020761 A1* 1/2022 Yeh ......................... H10B 43/35

FOREIGN PATENT DOCUMENTS

| | | | | |
|---|---|---|---|---|
| EP | 4174864 A1 * | 5/2023 | ............. | H10B 41/35 |
| TW | 202316423 | 4/2023 | | |

OTHER PUBLICATIONS

"Office Action of Taiwan Counterpart Application", issued on May
20, 2024, pp. 1-7.

* cited by examiner

*Primary Examiner* — Wael M Fahmy
*Assistant Examiner* — Quinton A Brasfield
(74) *Attorney, Agent, or Firm* — J.C. PATENTS

(57) ABSTRACT

A memory device includes a substrate and first to fourth
tiers. The first tier is located on the substrate and includes
first transistors and second transistors. The first transistors
includes multiple groups. The second tier includes a com-
posite stack structure. The third tier includes local bit lines
and local source lines. Each of the local bit lines is connected
to a first terminal of one of the first transistors. Each of the
local source lines is connected to a first terminal of one of
the second transistors. The fourth tier includes multiple
global bit lines and a common source line. Each of the global
bit lines is connected to second terminals of the first tran-
sistors in one of the groups. The common source line is
connected to a second terminal of each of the second
transistors. Embodiments of the present disclosure may be
applied to a 3D AND flash memory.

16 Claims, 29 Drawing Sheets

(51) Int. Cl.
    *H10B 43/27*        (2023.01)
    *H10B 80/00*        (2026.01)

SM1

R1

←—VIII     ←—VII

←—VIII'     ←—VII'

R2

E1

⊠

E2

⊠

E1

←—T2

E1

⊠

E2

⊠

E1

←—T1

←—VI

E1

⊠

←—VI'   E2

⊠

E1

←—T2

←—V

E1

⊠

←—V'   E2

⊠

E1

←—T1

←—IV     ←—III

←—IV'     ←—III'

MEMORY DEVICE

BACKGROUND

Technical Field

The embodiments of the present disclosure relate to a semiconductor device, and particularly to a memory device.

Description of Related Art

A non-volatile memory device (e.g., a flash memory) has the advantage that stored data does not disappear at power-off, so it becomes a widely used memory device for a personal computer or other electronic equipment.

Currently, the flash memory arrays commonly used in the industry include a NOR flash memory and a NAND flash memory. The NAND flash memory has multiple memory cells connected in series, so the NAND flash memory has better integration and area utilization than the NOR flash memory, and has been widely used in various electronic products. In addition, in order to further enhance the integration of memory devices, a three-dimensional NAND flash memory has been developed. However, there are still many challenges associated with a three-dimensional NAND flash memory.

SUMMARY

The present disclosure provides a memory device capable of saving space, in which the spacing between a common source line and global bit lines at the same tier is increased, and wider pitch and less wiring are provided for the back end of line (BEOL) process.

A memory device according to an embodiment of the present disclosure includes a substrate and first to fourth tiers. The first tier is located on the substrate and includes multiple first transistors and multiple second transistors. The first transistors includes multiple groups. The second tier includes a composite stack structure. The third tier includes multiple local bit lines and multiple local source lines. Each of the local bit lines is connected to a first terminal of one of the first transistors. Each of the local source lines is connected to a first terminal of one of the second transistors. The fourth tier includes multiple global bit lines and a common source line. Each of the global bit lines is connected to second terminals of the first transistors in one of the groups. The common source line is connected to a second terminal of each of the second transistors. Embodiments of the present disclosure may be applied to a 3D AND flash memory.

A memory device according to an embodiment of the present disclosure includes multiple first transistors, multiple local bit lines, multiple global bit lines, multiple second transistors, multiple local source lines and a common source line. The first transistors are divided into multiple groups. Each of the local bit lines is electrically connected to a first terminal of one of the first transistors. Each of the global bit lines is electrically connected to multiple second terminals of the first transistors in one of the groups. Each of the local source lines is connected to a first terminal of one of the second transistors. The common source line is connected to a second terminal of each of the second transistors.

Based on the above, the embodiment of the present disclosure uses a common source line to save space. Therefore, the spacing between the common source line (CSL) and the global bit lines (GBL) at the same tier can be increased. Due to the common source line design, the wider pitch and less wiring are provided for the back end of line (BEOL) process, so as to reduce the CSL/GBL short rate.

BRIEF DESCRIPTION OF THE DRAWINGS

FIG. 2A to FIG. 2D are top views of a method of fabricating a memory device according to an embodiment of the present disclosure.

DESCRIPTION OF THE EMBODIMENTS

Figure 1:
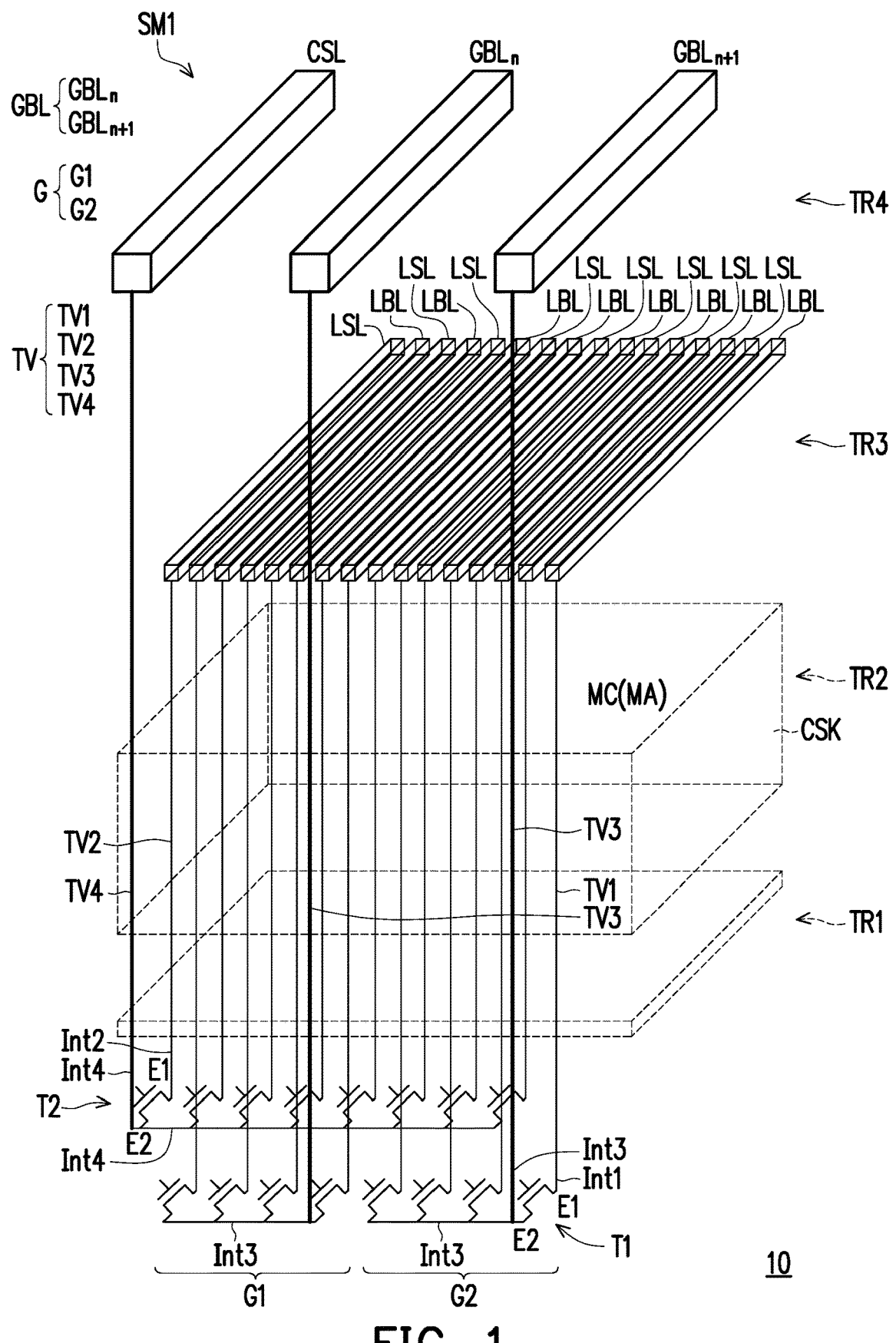
FIG. 1 is a circuit diagram of a memory device according to an embodiment of the present disclosure.
Figure 2A:
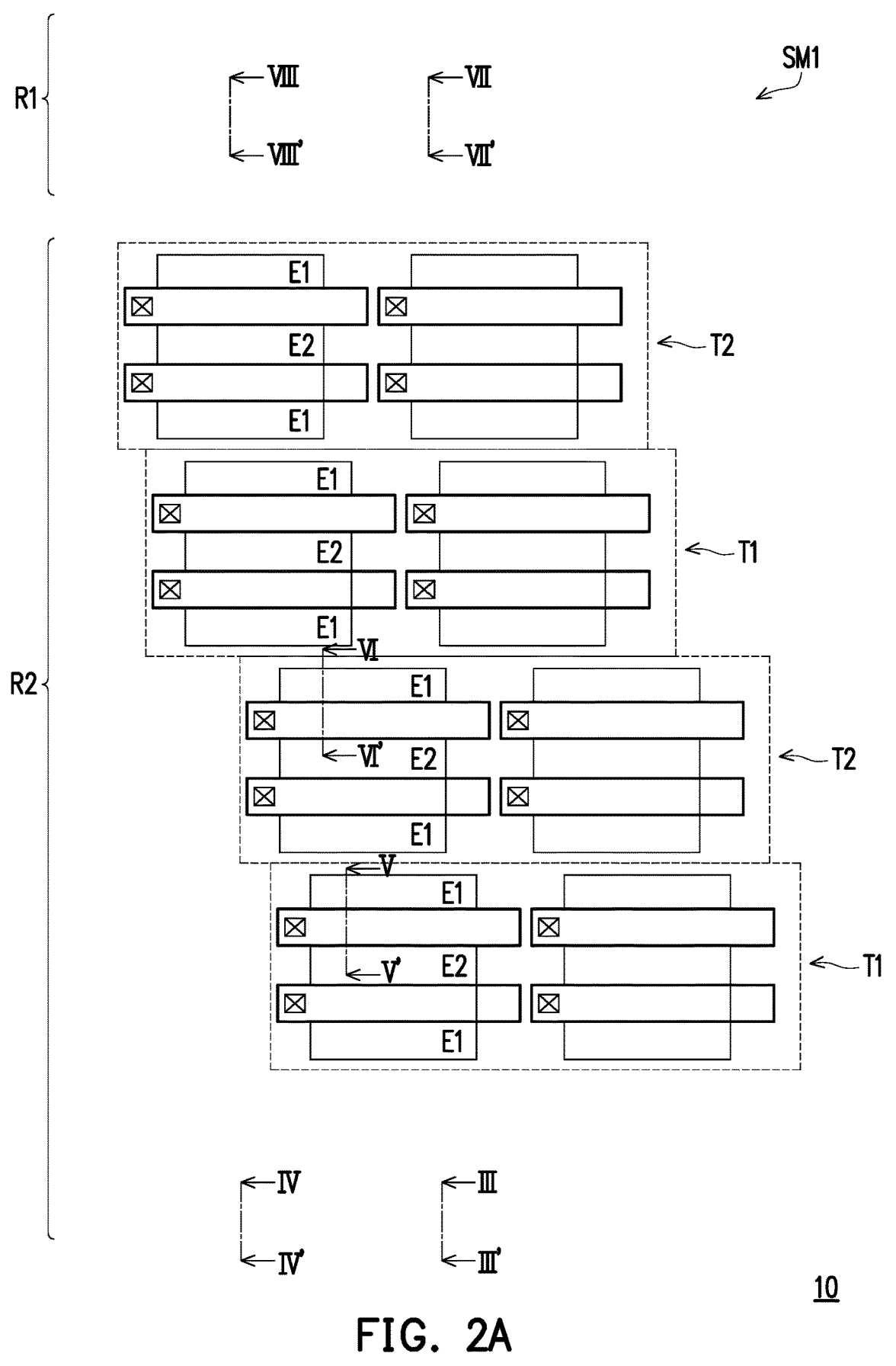
Figure 2B:
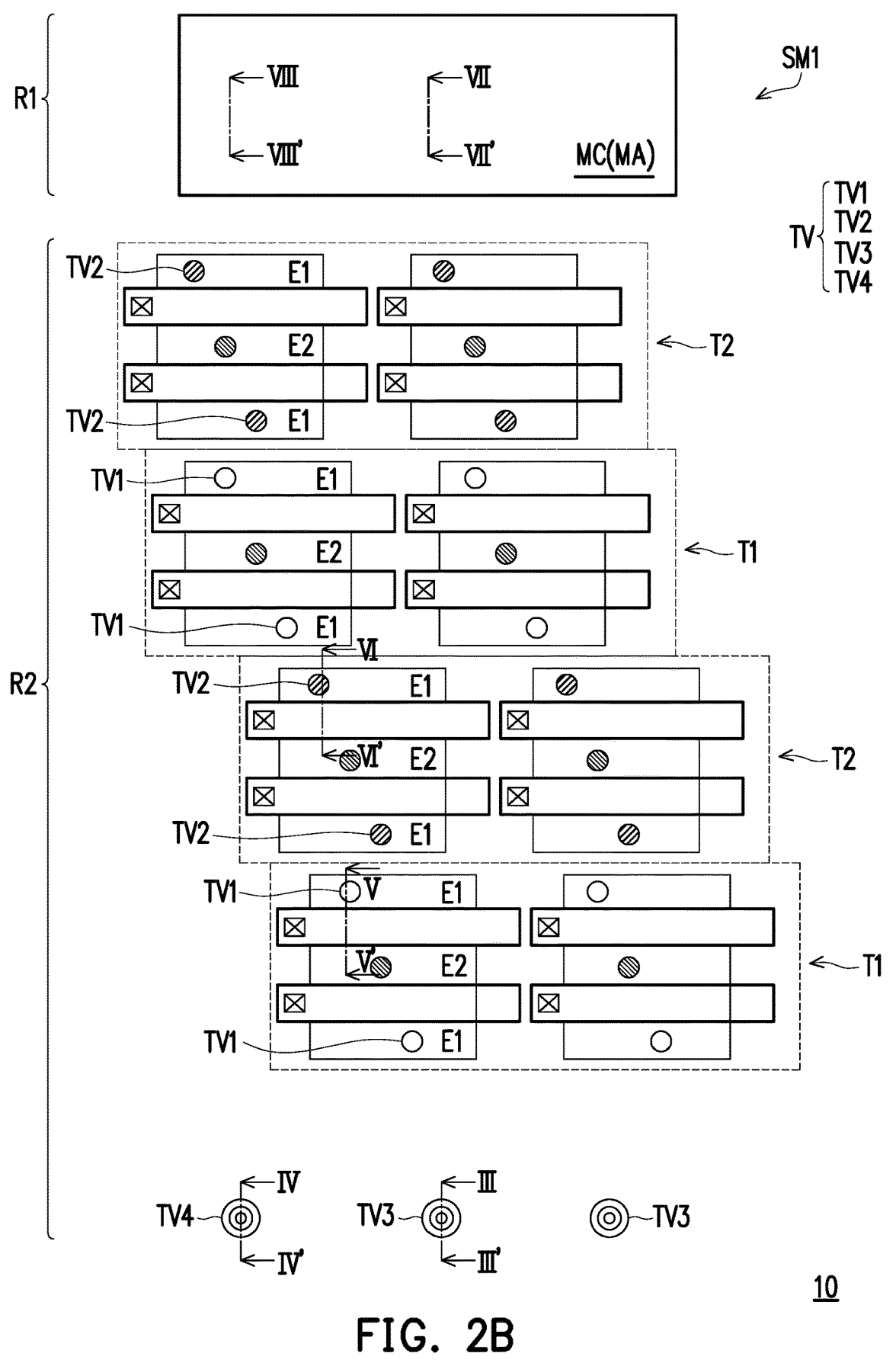
Figure 2C:
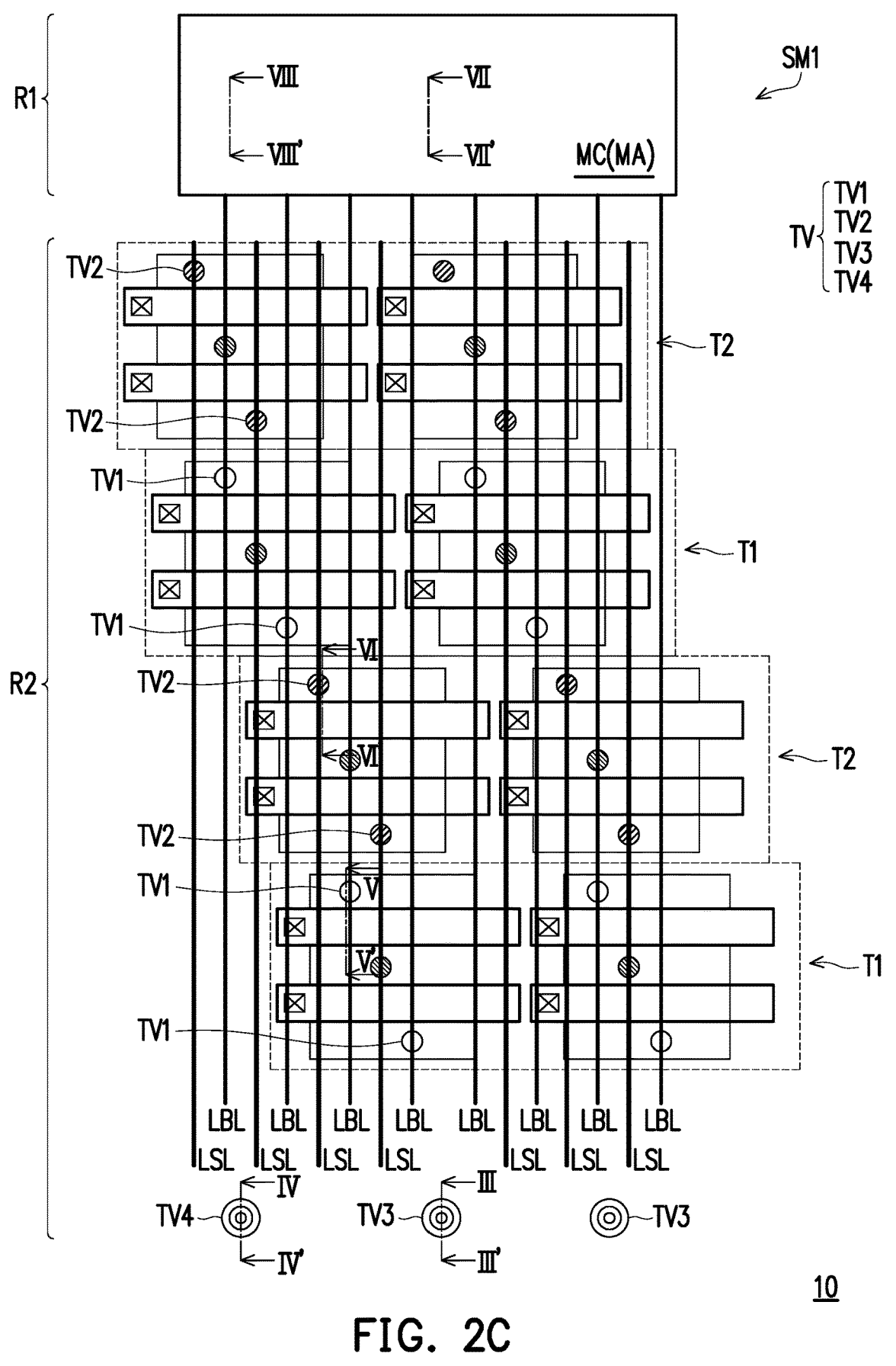
Figure 2D:
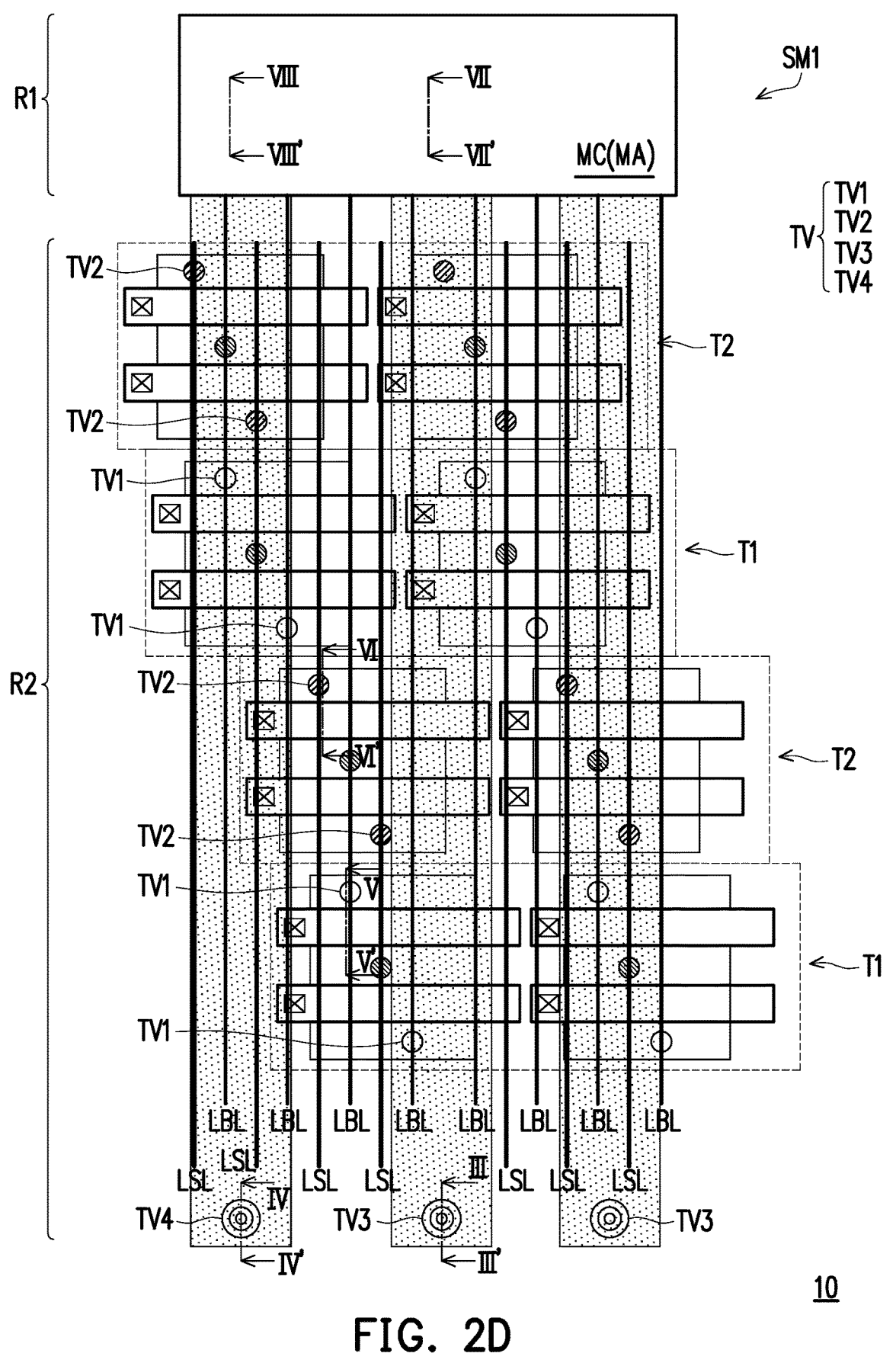

FIG. 1 is a circuit diagram of a memory device according to an embodiment of the present disclosure. FIG. 2D is a top view of a memory device according to an embodiment of the present disclosure. FIG. 3D to FIG. 8D are schematic cross-sectional views taken along the lines III-III' to VIII-VIII' of FIG. 2A to FIG. 2D.

Referring to FIG. 1, a memory device SM1 according to an embodiment of the present disclosure includes a substrate 10 and first to fourth tiers TR1 to TR4. Referring to FIG. 1, the first tier TR1 is located on the substrate 10. The first tier TR1 includes multiple first transistors T1 and multiple second transistors T2. In some embodiments, the number of first transistors T1 is the same as the number of the second transistors T2. The multiple first transistors T1 can be divided into multiple groups G, such as groups G1 and G2. The multiple second transistors T2 are not divided into groups.

The second tier TR2 is located on the first tier TR1. The second tier TR2 includes a composite stacked structure CSK. The composite stacked structure CSK includes a memory array MA composed of multiple memory cells MC.

The third tier TR3 is located on the second tier TR2. The third tier TR3 includes multiple local bit lines LBL and multiple local source lines LSL. The multiple local bit lines LBL and the multiple local source lines LSL are arranged alternately. The number of the local bit lines LBL is the same as the number of the local source lines LSL.

The fourth tier TR4 is located on the third tier TR3. The fourth tier TR4 includes multiple global bit lines GBL and a common source line CSL. The global bit lines GBL may include global bit lines $GBL_n$, $GBL_{n+1}$, etc.

Figure 7A:
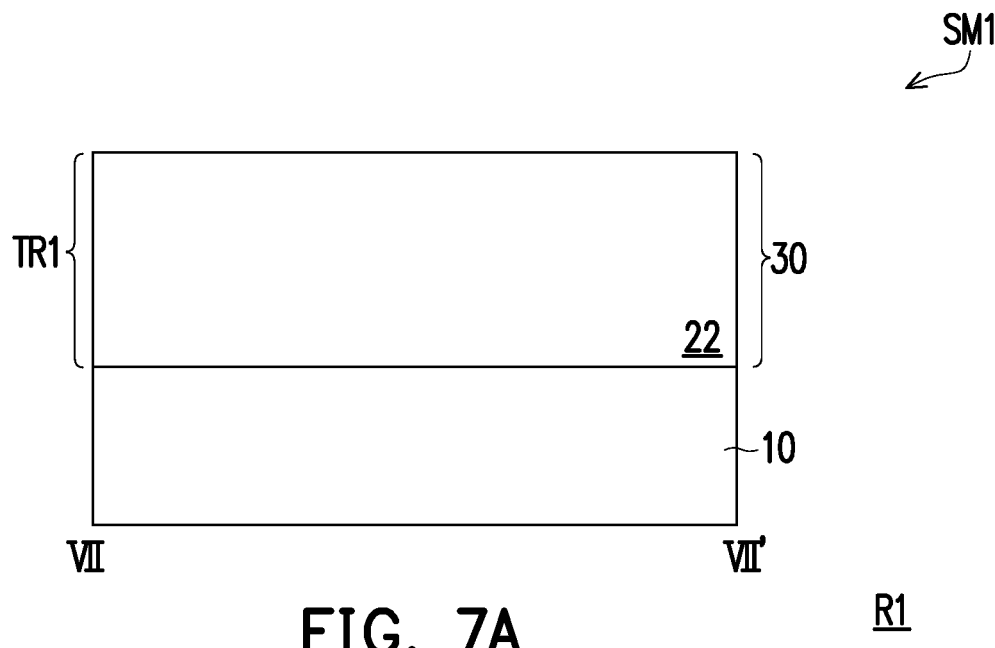
FIG. 7A to FIG. 7D are schematic cross-sectional views taken along the line VII-VII' of FIG. 2A to FIG. 2D.
Figure 7B:
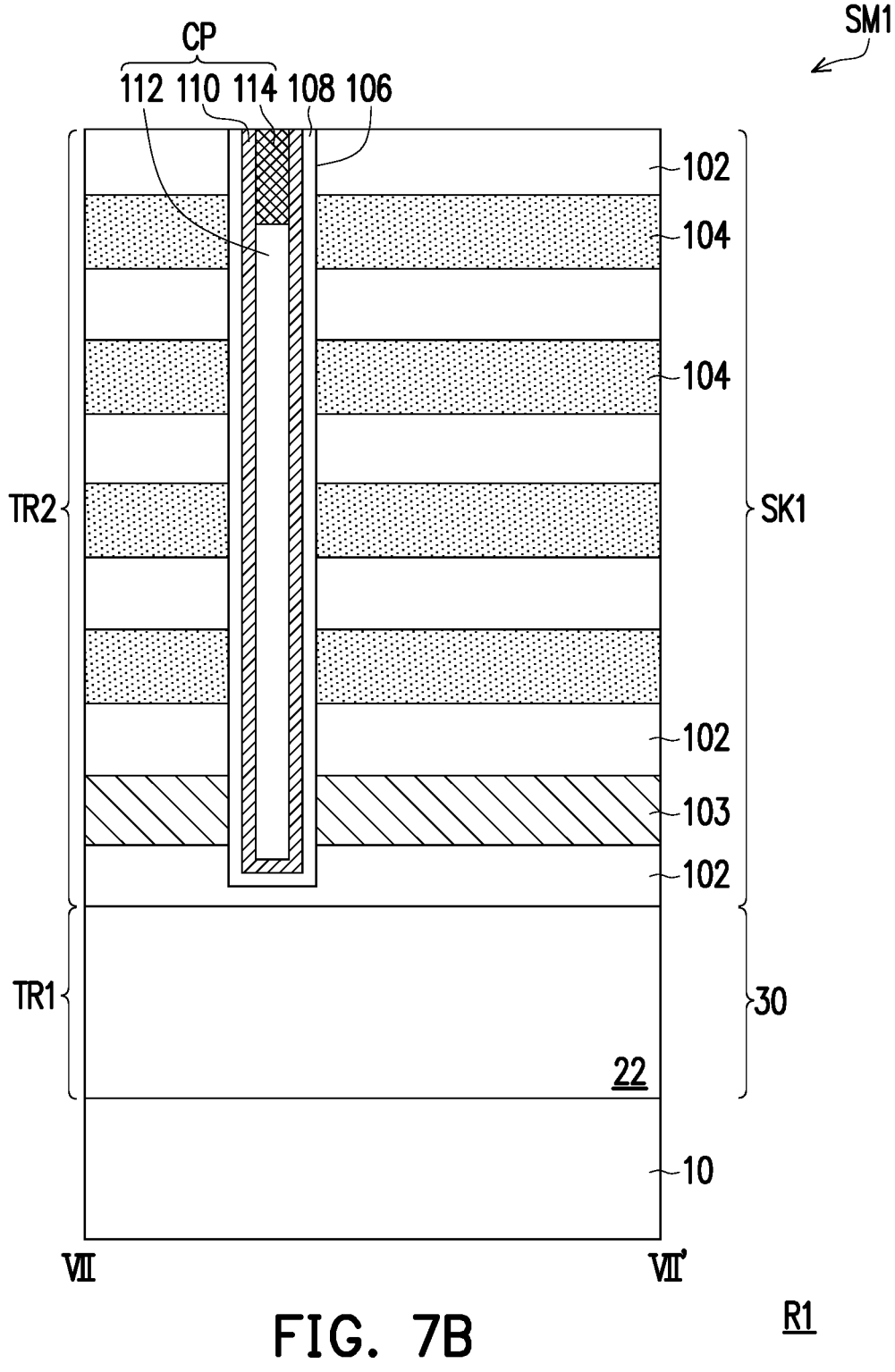
Figure 7C:
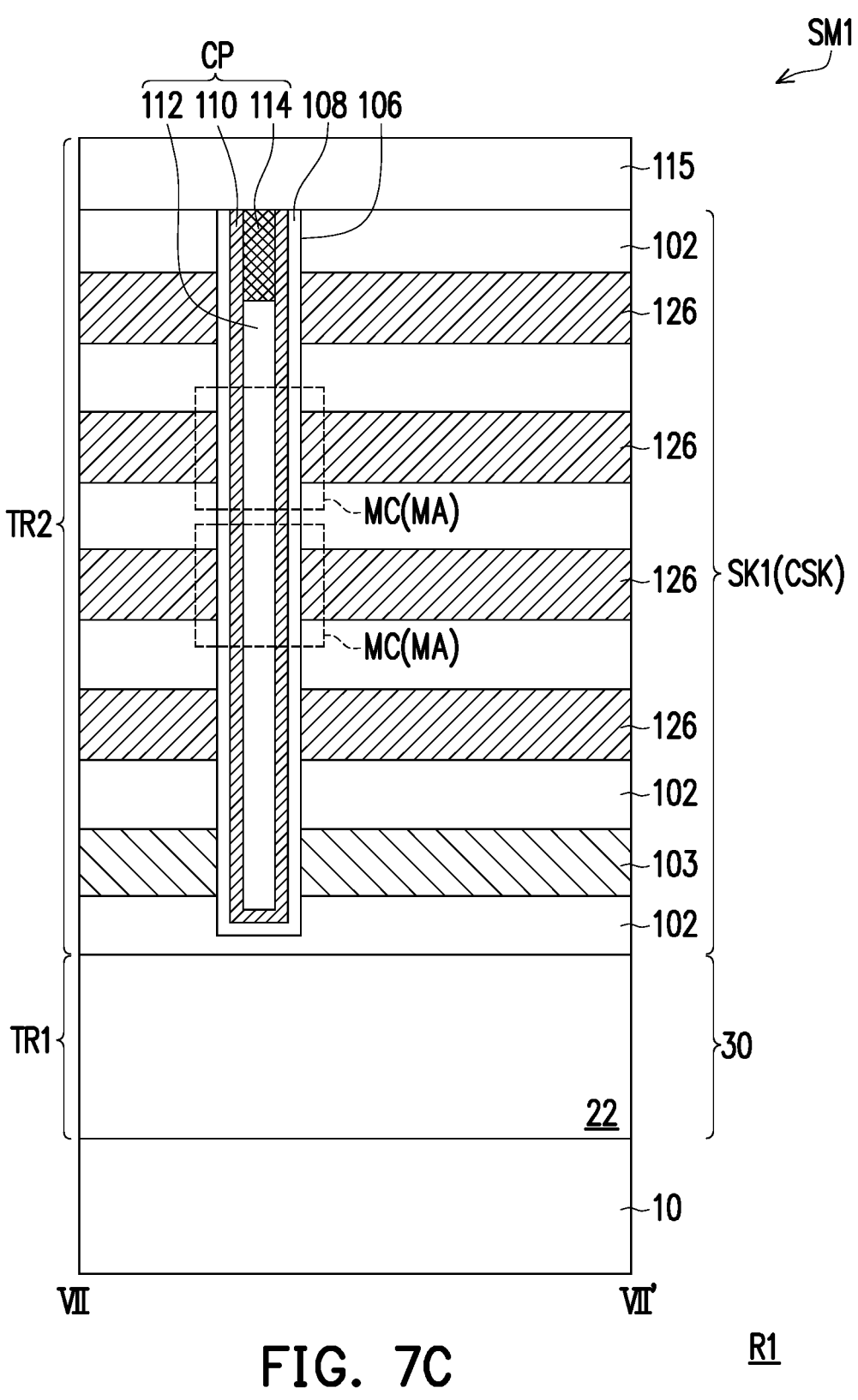
Figure 7D:
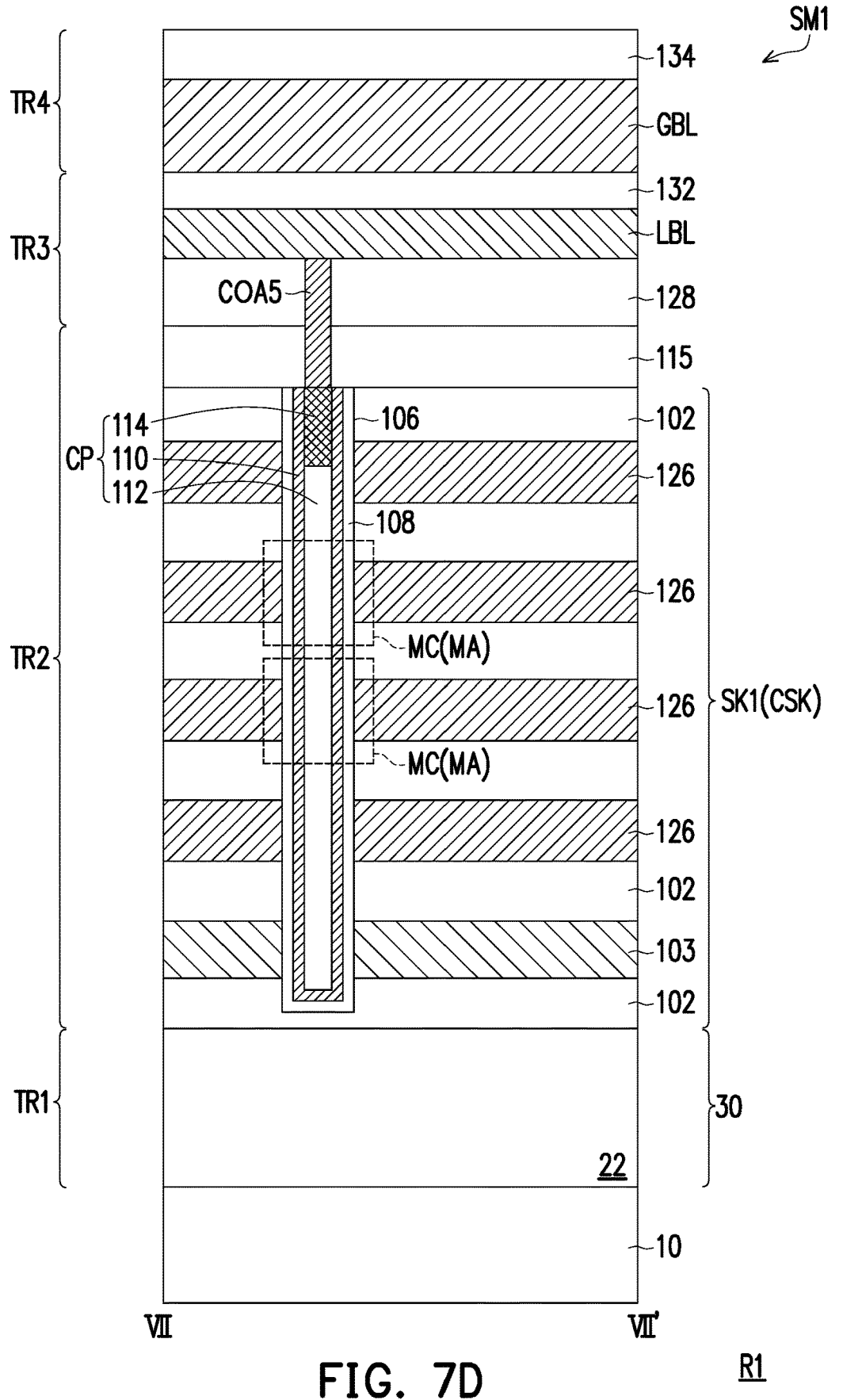
Figure 8A:
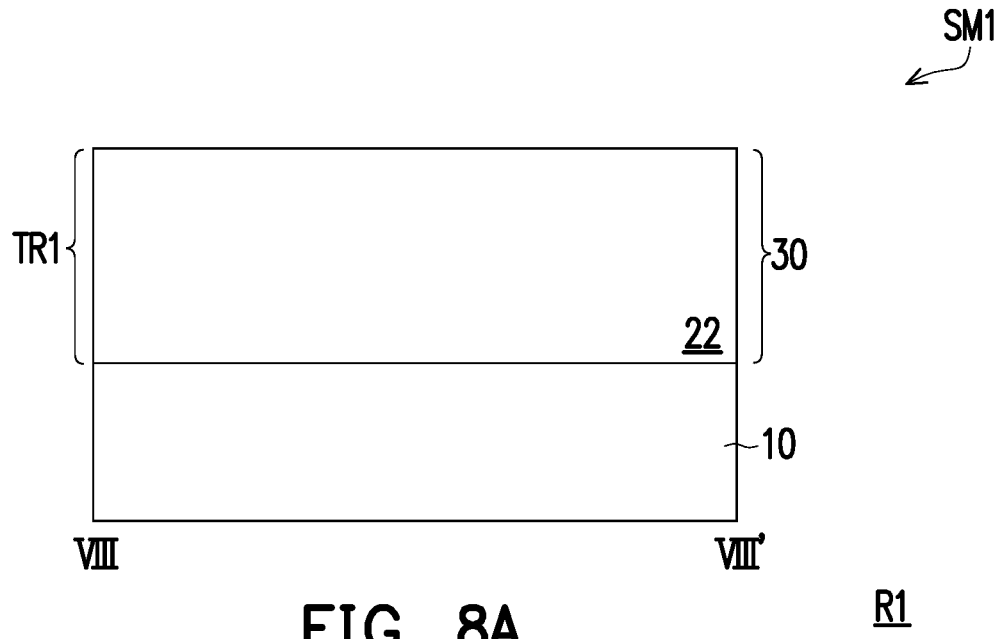
FIG. 8A to FIG. 8D are schematic cross-sectional views taken along the line VIII-VIII' of FIG. 2A to FIG. 2D.
Figure 8B:
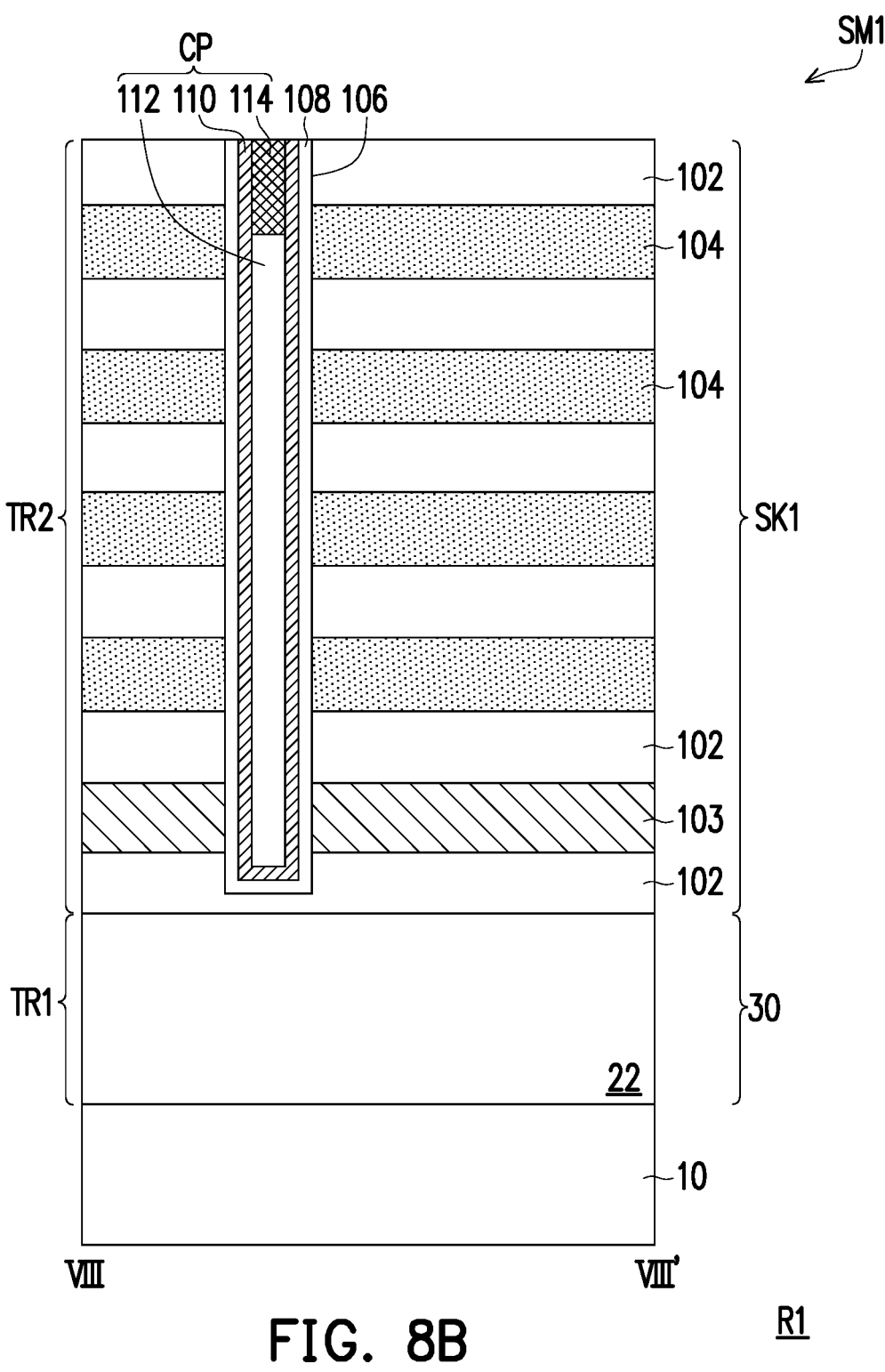
Figure 8C:
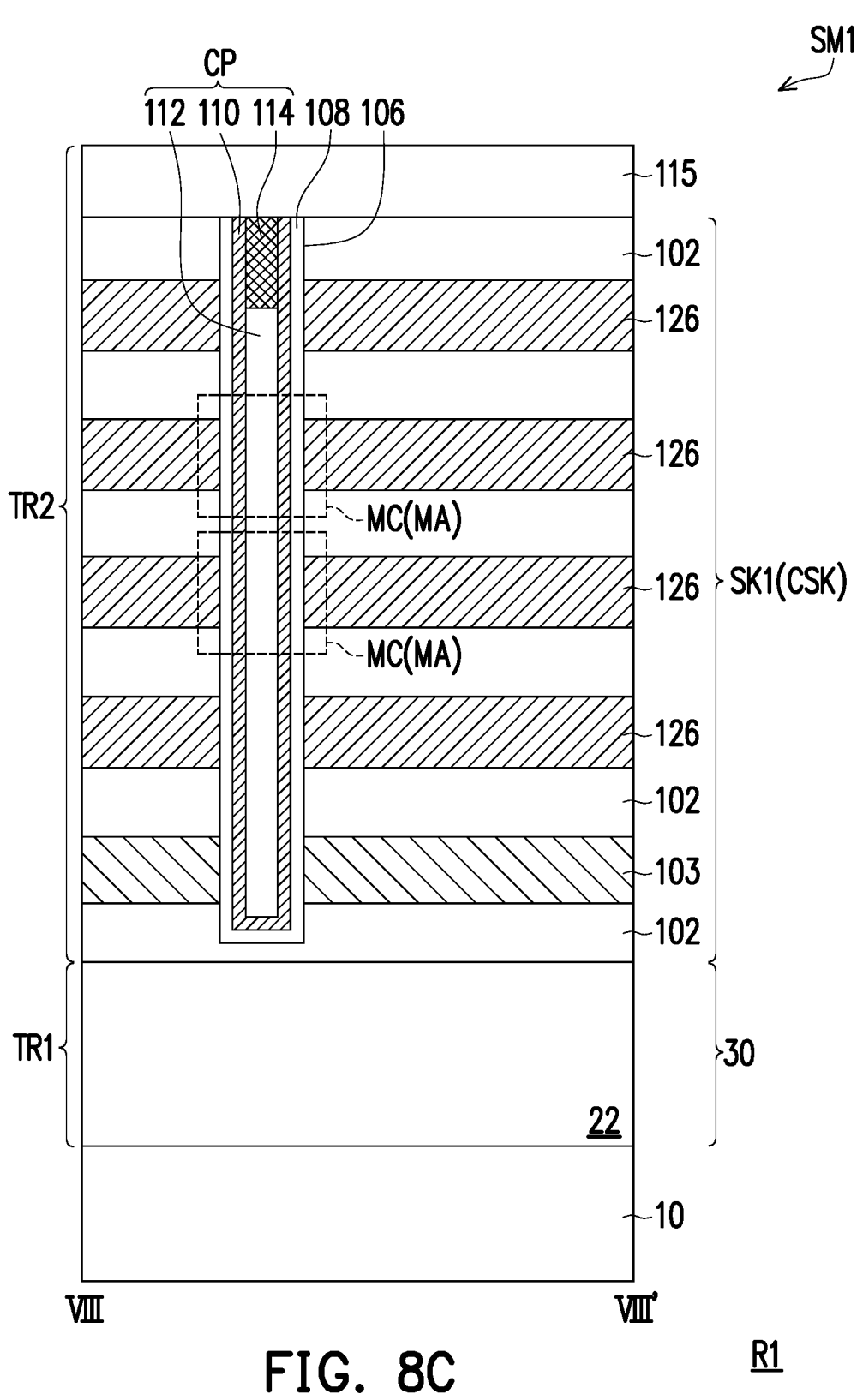
Figure 8D:
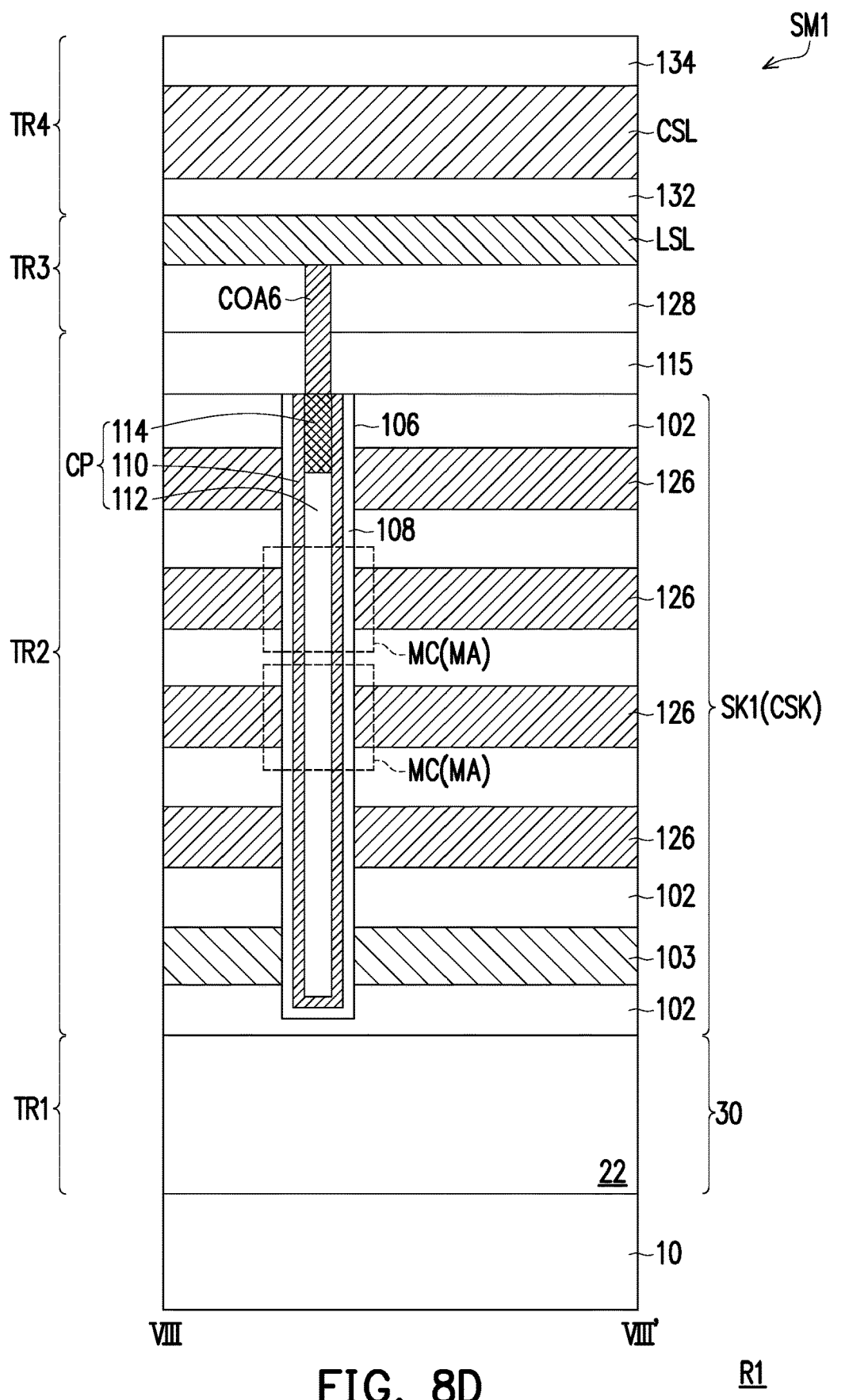

Each local bit line LBL and each local source line LSL are electrically connected to multiple memory cells MC in the composite stacked structure CSK (shown in FIG. 7D and FIG. 8D). Each local bit line LBL is also electrically connected to the first terminal E1 of one of the multiple first transistors T1. Each local source line LSL is connected to the first terminal E1 of one of the multiple second transistors T2. Each global bit line GBL is electrically connected to multiple second terminals E2 of the multiple first transistors T1 in one of the multiple groups G. For example, the global bit line $GBL_n$ is connected to multiple second terminals E2 of the multiple first transistors T1 in the group G1. The global bit line $GBL_{n+1}$ is connected to multiple second terminals E2 of the multiple first transistors T1 in the group G2. The common source line CSL is connected to the second terminal E2 of each second transistor T2.

In the embodiment of the present disclosure, multiple global bit lines GBL and only one common source line CSL are present at the fourth tier TR4. The number of common source line CSL is less than the number of global bit lines GBL. Therefore, the spacing between the common source line CSL and the global bit lines GBL at the fourth tier TR4 is increased, and wider pitch and less wiring are provided for the back end of line (BEOL) process.

Referring to FIG. 3D to FIG. 8D, the first tier TR1 of the embodiment of the present disclosure may further include an interconnect structure 30. The interconnect structure 30 includes a dielectric layer 22 and multiple interconnect lines Int1, Int2, Int3, Int4. The dielectric layer 22 covers the substrate 10 and the multiple first transistors T1 and the multiple second transistors T2. Multiple interconnect lines Int1, multiple interconnect lines Int2, multiple interconnect lines Int3, and single interconnect line Int4 may include wires and plugs, respectively.

Figure 5A:
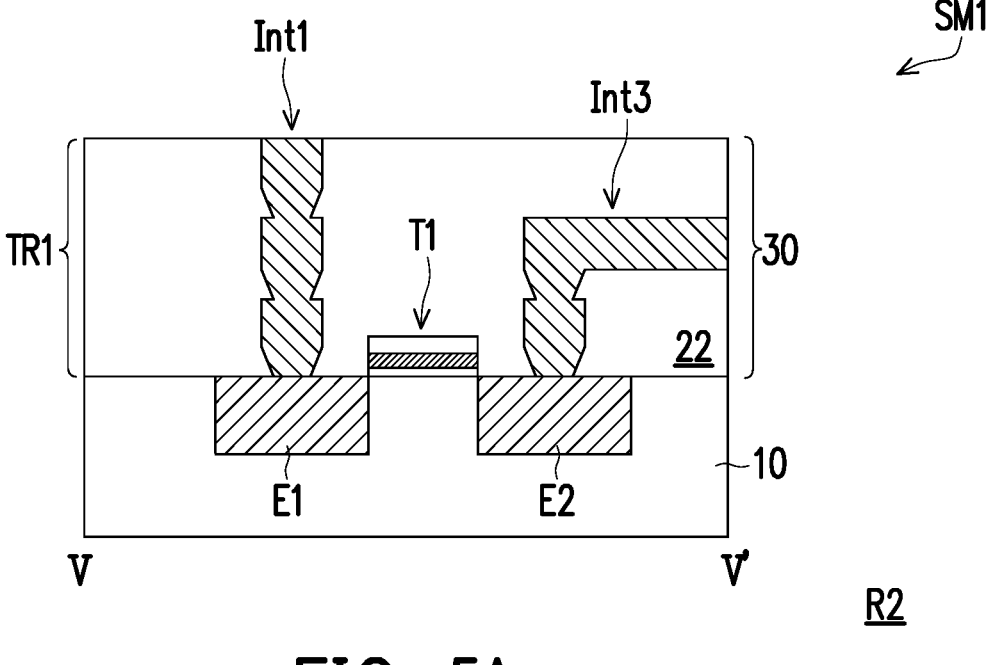
FIG. 5A to FIG. 5D are schematic cross-sectional views taken along the line V-V' of FIG. 2A to FIG. 2D.
Figure 5B:
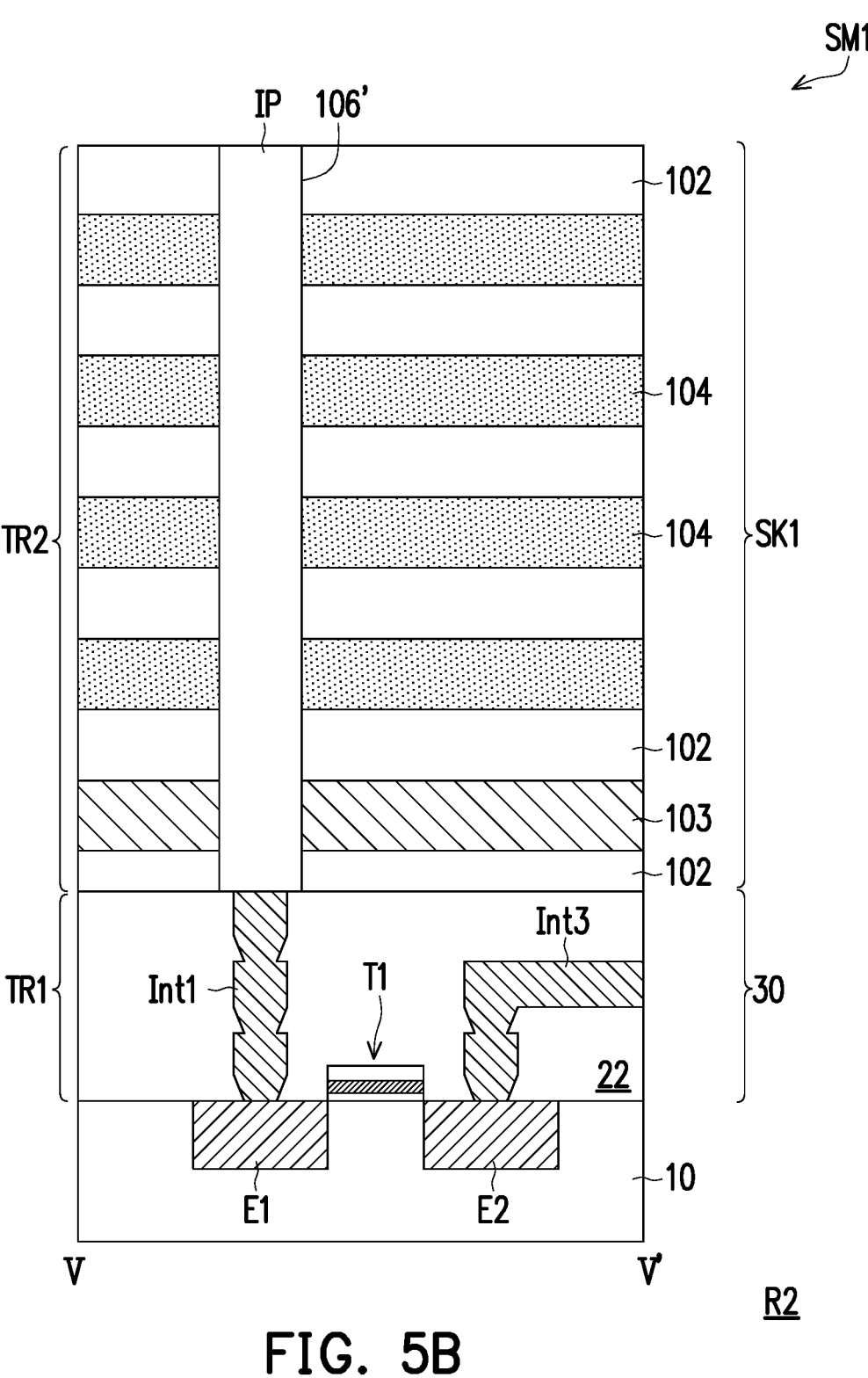
Figure 5C:
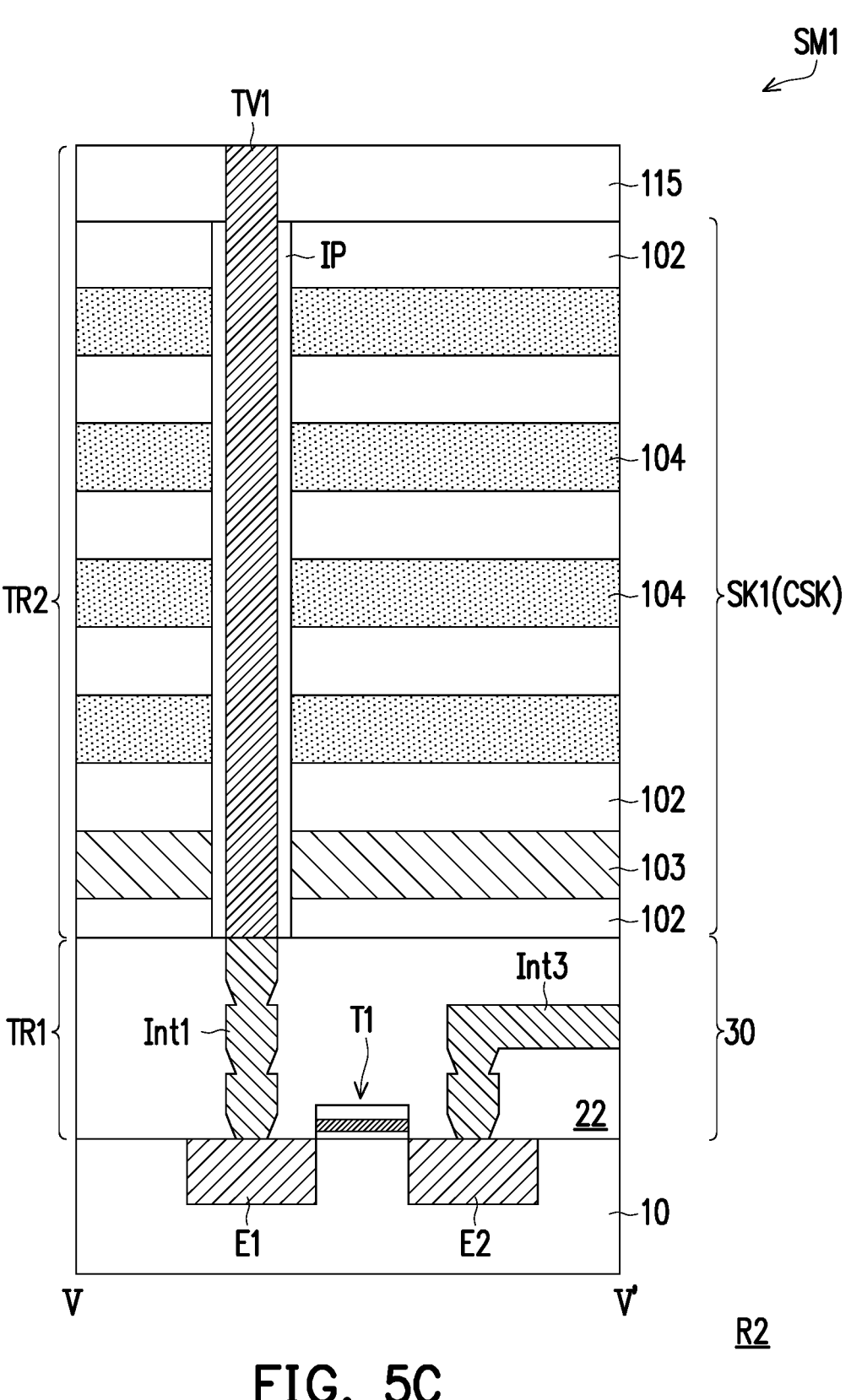
Figure 5D:
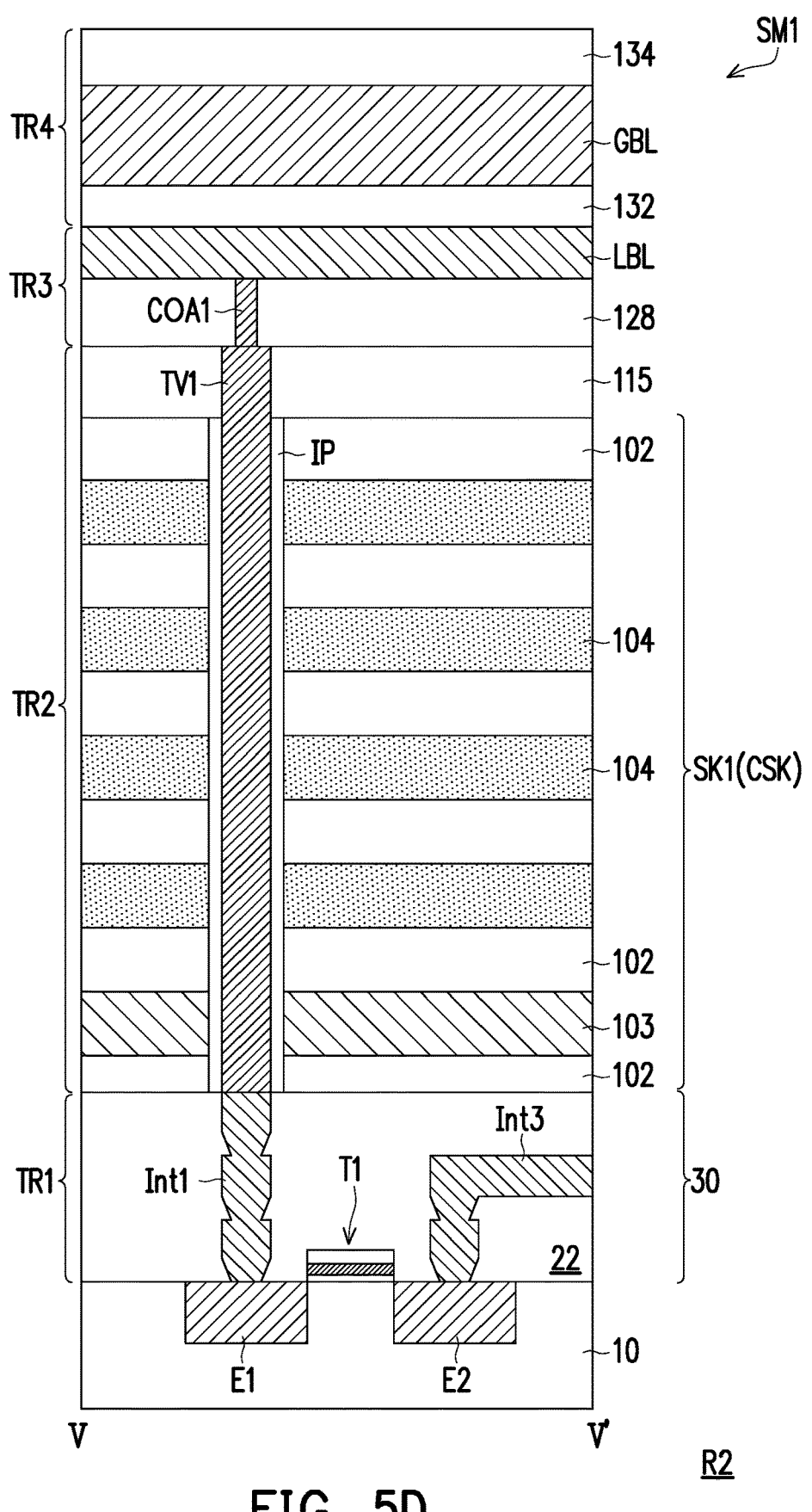

Referring to FIG. 1 and FIG. 5D, each interconnect line Int1 is connected to the first terminal E1 of the first transistor T1. Each interconnect line Int3 is connected to the second terminal E2 of the first transistor T1, and is connected to multiple second terminals E2 of the multiple first transistors T1 that are in the same group G.

Figure 6A:
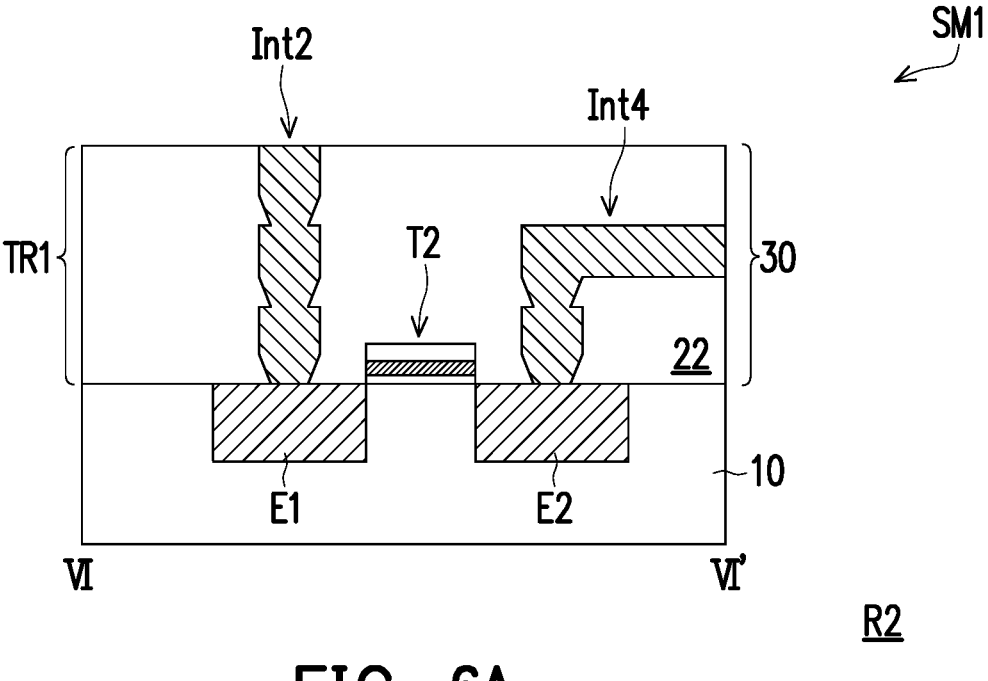
FIG. 6A to FIG. 6D are schematic cross-sectional views taken along the line VI-VI' of FIG. 2A to FIG. 2D.
Figure 6B:
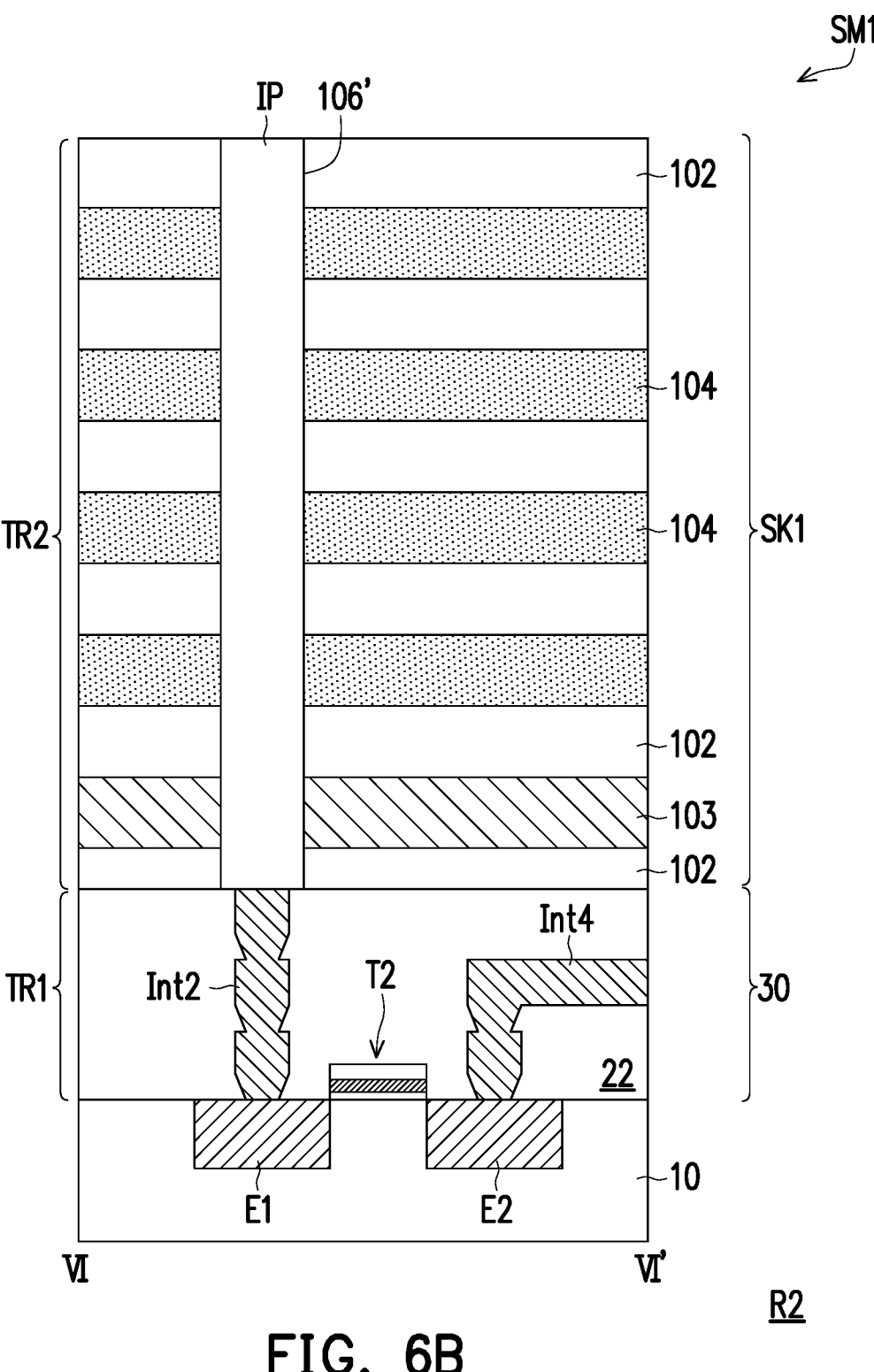
Figure 6C:
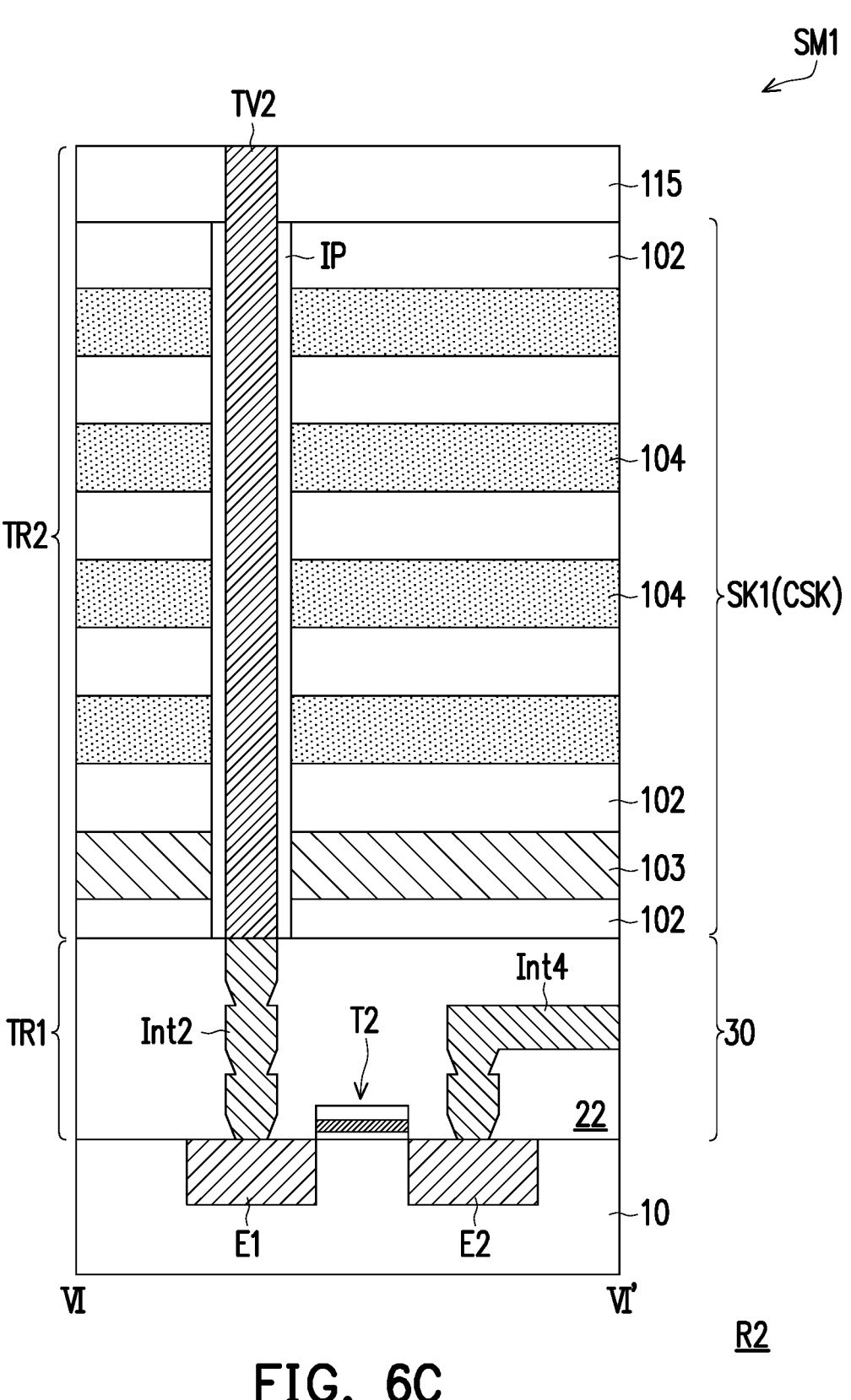
Figure 6D:
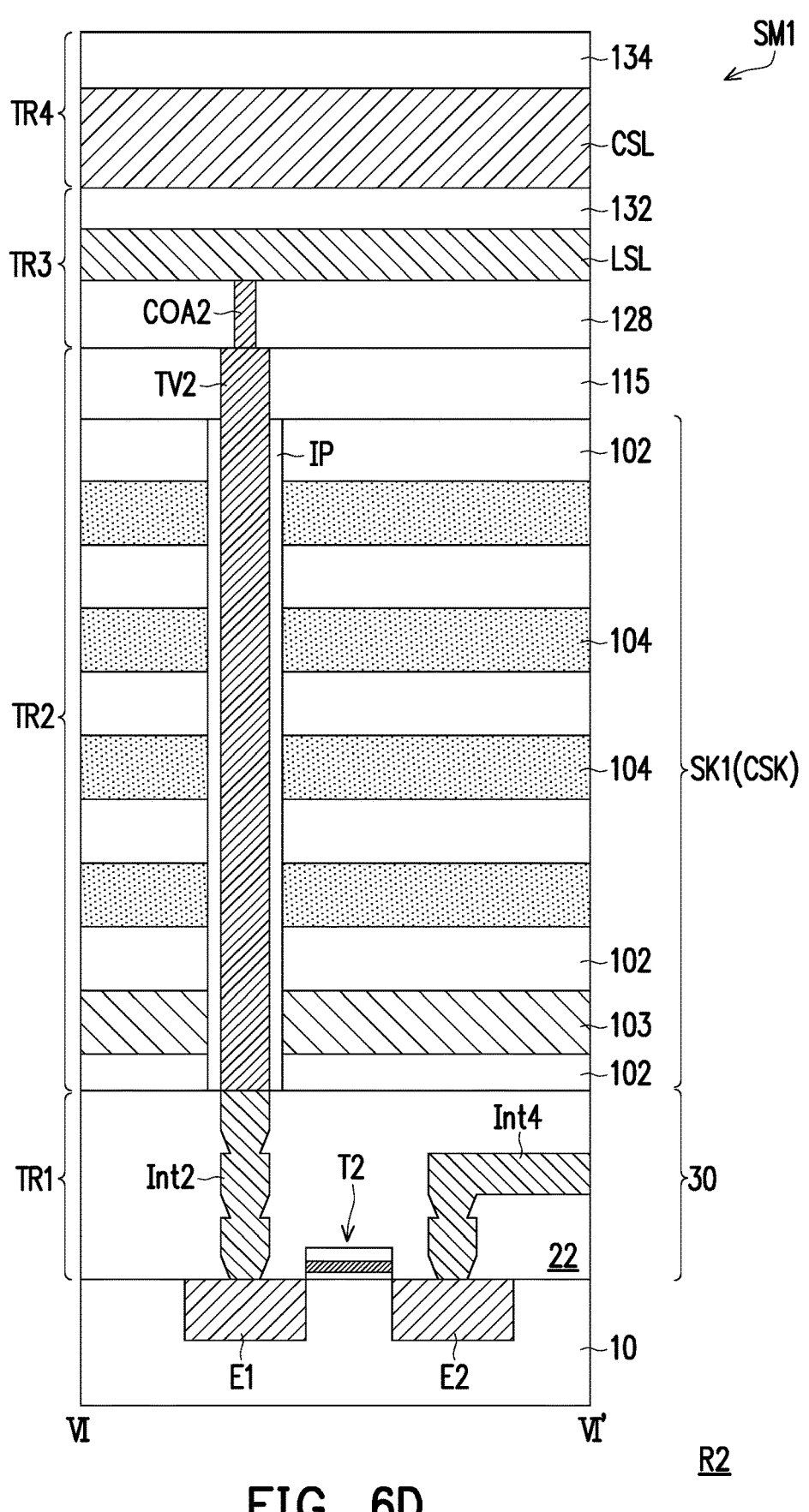

Referring to FIG. 1 and FIG. 6D, each interconnect line Int2 is connected to the first terminal E1 of the second transistor T2. The interconnect line Int4 is connected to the second terminal E2 of the second transistor T2, and is connected to multiple second terminals E2 of the multiple first transistors T2 that are not grouped.

Referring to FIG. 1 and FIG. 7D, the composite stacked structure CSK at the second tier TR2 includes a first stacked structure SK1 (shown in FIG. 3D to FIG. 6D) and a second stacked structure SK2 (shown in FIG. 7D and FIG. 8D).

Referring to FIG. 3D to FIG. 6D, the first stacked structure SK1 of the composite stacked structure CSK is located in a periphery region R2. The first stacked structure SK1 includes multiple insulating layers 102 and multiple intermediate layers 104 stacked alternately.

Referring to FIG. 3D to FIG. 6D, the second tier TR2 further includes multiple through vias TV. The multiple through vias TV extend through the composite stacked structure CSK. The multiple through vias TV include multiple through vias TV1, multiple through vias TV2, multiple through vias TV3 and single through via TV4.

Referring to FIG. 1 and FIG. 5D, a first through via TV1 extends through the first stacked structure SK1, and is electrically connected to the first terminal E1 of the first transistor T1 through an interconnect line Int1. Referring to FIG. 6D, a second through via TV2 extends through the first stacked structure SK1, and is electrically connected to the first terminal E1 of the second transistor T2 through an interconnect line Int2. The number of first through vias TV1 is equal to the number of second through vias TV2, as shown in FIG. 2B.

Figure 3A:
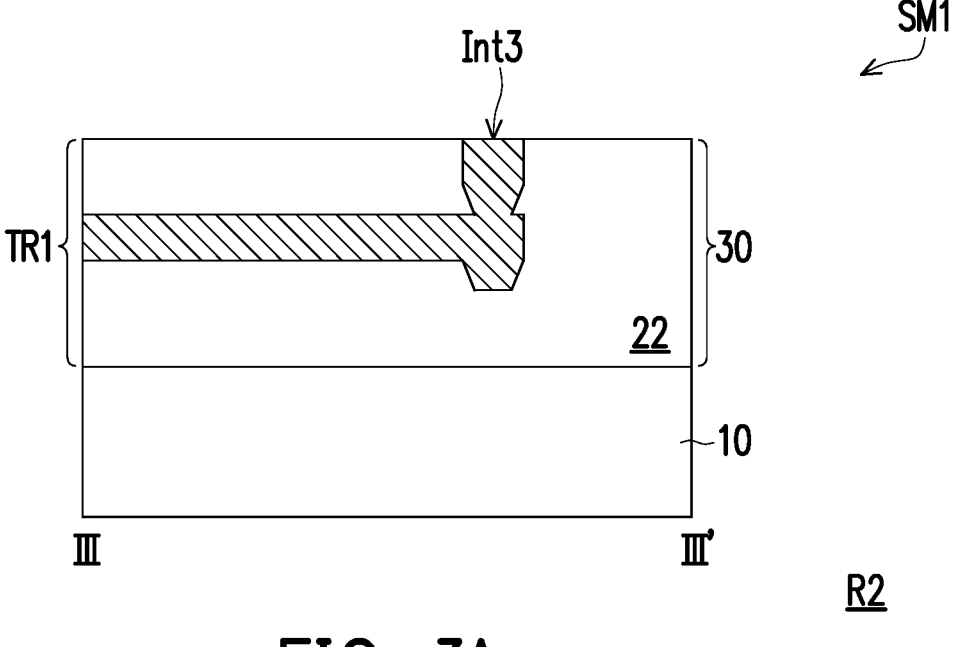
FIG. 3A to FIG. 3D are schematic cross-sectional views taken along the line III-III' of FIG. 2A to FIG. 2D.
Figure 3B:
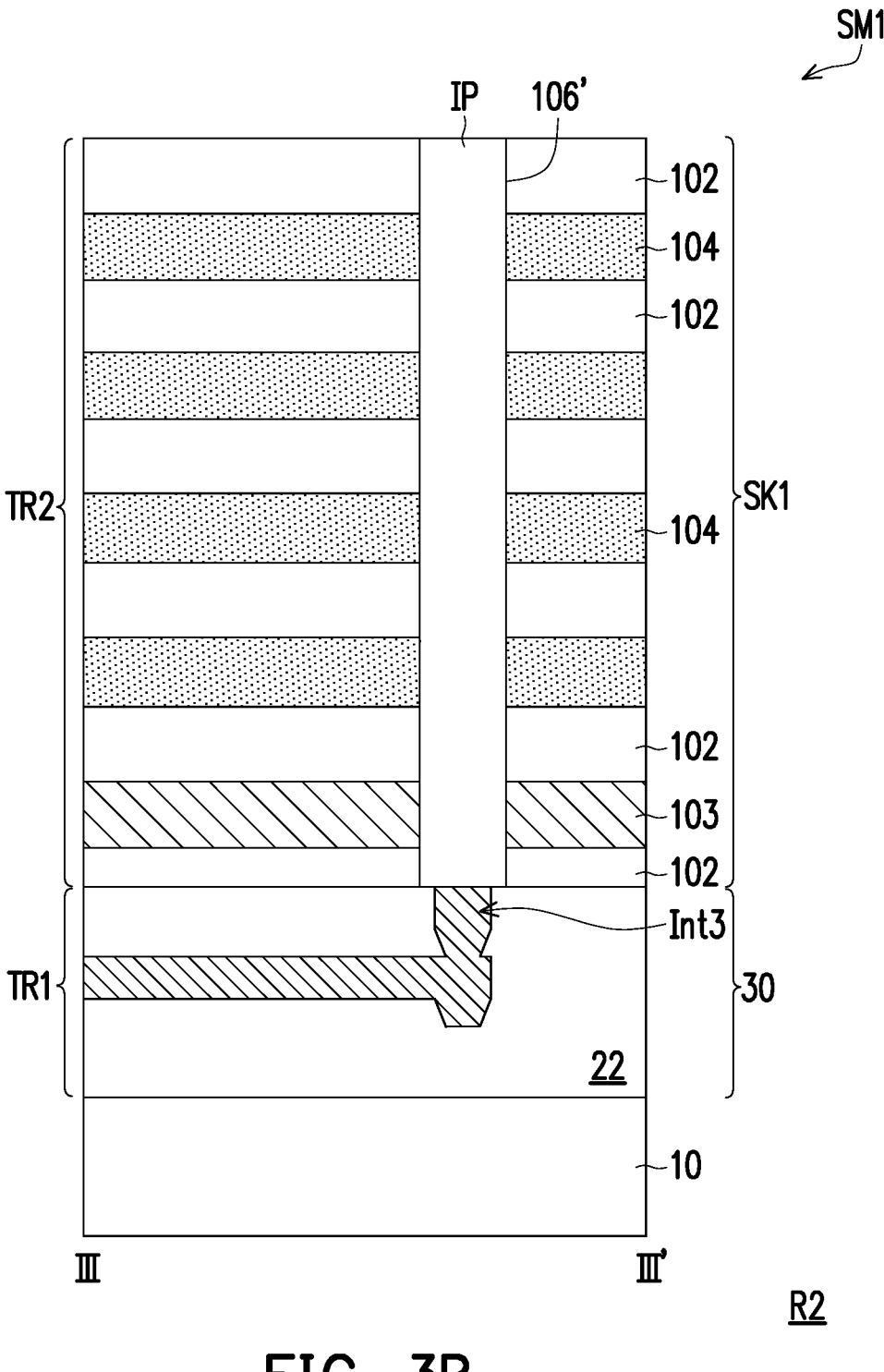
Figure 3C:
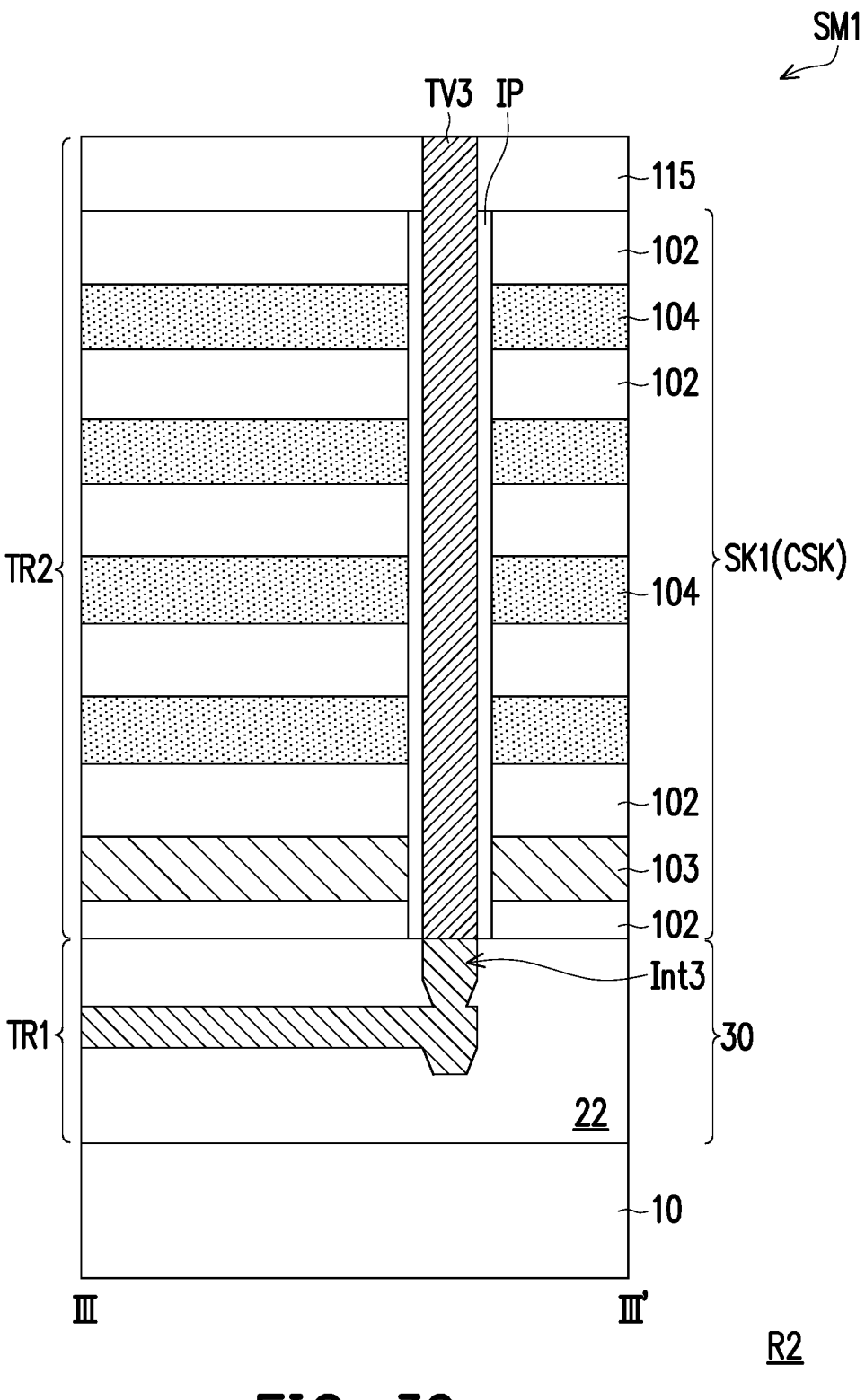
Figure 3D:
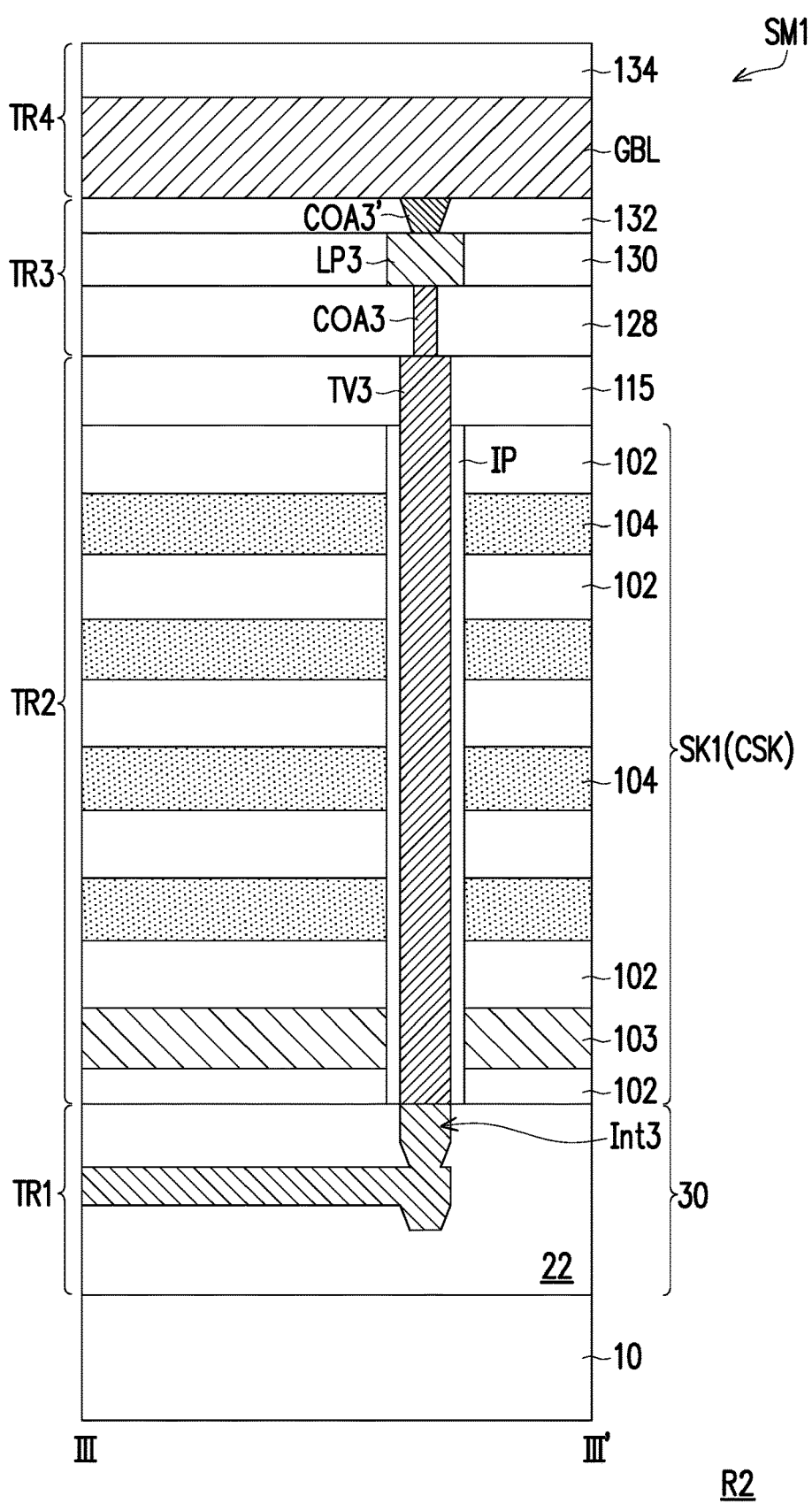

Referring to FIG. 1 and FIG. 3D, one of the third through vias TV3 extends through the first stacked structure SK1, and is electrically connected to the multiple second terminals E2 of the multiple first transistors T1 in the group G1 through the interconnect line Int3. Referring to FIG. 1, another one of the third through vias TV3 extends through the first stacked structure SK1, and is electrically connected to the second terminals E2 of the first transistors T1 in the group G2 through another interconnect line Int3. Referring to FIG. 1 and FIG. 4D, the fourth through via TV4 extends through the first stacked structure SK1, and is electrically connected to the second terminal E2 of each second transistor T2 through an interconnect line Int4. Therefore, the number of fourth through via TV4 is less than the number of multiple third through vias TV3, as shown in FIG. 2C.

Referring to FIG. 7D and FIG. 8D, the second stacked structure SK2 of the composite stacked structure CSK is located in a memory plane region R1. The second stacked structure SK2 includes multiple insulating layers 102 and multiple conductive layers 126 stacked alternately. The second tier TR2 also includes multiple channel pillars CP and multiple charge storage structures 108. The multiple channel pillars CP extend through the second stacked structure SK2. The multiple charge storage structures 108 are interposed between the multiple channel pillars CP and the second stacked structure SK2. The multiple conductive layers 126, the multiple channel pillars CP and the multiple charge storage structures 108 form multiple memory cells MC. Multiple memory cells MC form a memory array MA.

Referring to FIG. 5D and FIG. 7D, each local bit line LBL located at the third tier TR3 is electrically connected to one of the multiple channel pillars CP (shown in FIG. 7) through a contact COA5, and is electrically connected to the first terminal E1 (shown in FIG. 5D) of one of the multiple first transistors T1 through a contact COA1, a first through via TV1 and an interconnect line Int1.

Referring to FIG. 6D and FIG. 8D, each local source line LSL located at the third tier TR3 is electrically connected to another one of the multiple channel pillars CP (shown in FIG. 8D) through a contact COA6, and is electrically connected to the first terminal E1 (shown in FIG. 6D) of one of the multiple second transistors T2 through a contact COA2, a second through via TV2 and an interconnect line Int2.

Referring to FIG. 3D, each of multiple global bit lines GBL located at the fourth tier TR4 is electrically connected to multiple second terminals E2 of the multiple first transistors T1 in the same group G through a contact COA3', a connection pad LP3, a contact COA3, a third through via TV3 and an interconnect line Int3, as shown in FIG. 1.

Referring to FIG. 4D, the common source line CSL at the fourth tier TR4 is electrically connected to the second terminal E2 of each second transistor T2 through a contact COA4', a connection pad LP4, a contact COA4, a fourth through via TV4, and an interconnect line Int4, as shown in FIG. 1.

Referring to FIG. 3D and FIG. 4D, FIG. 4D, and FIG. 5D, the local bit line LBL and the global bit line GBL can be electrically connected to the first transistor T1 through the through vias TV1 and TV3 respectively. The local source line LSL and the common source line CSL can be electrically connected to the second crystal T2 through the through vias TV2 and TV4 respectively.

Each local bit line LBL is electrically connected to the first terminal E1 of one of the first transistors T1 through one of the first through vias TV1. Each local source line LSL is electrically connected to the first terminal E1 of one of the multiple second transistors T2 through the second through via TV2. The number of first through vias TV1 is equal to the number of second through vias TV2. Each global bit line GBL is electrically connected to multiple second terminals E2 of the multiple first transistors T1 in one of the multiple groups G through one of the multiple third through vias TV3. The common source line CSL is electrically connected to the second terminal E2 of each second transistor T2 through the fourth through via TV4. Therefore, the number of fourth through via TV4 is less than the number of multiple third through vias TV3.

FIG. 2A to FIG. 2D are top views of a method of fabricating a memory device according to an embodiment of the present disclosure. FIG. 3A to FIG. 3D are schematic cross-sectional views taken along the line III-III' of FIG. 2A to FIG. 2D. FIG. 4A to FIG. 4D are schematic cross-sectional views taken along the line IV-IV' of FIG. 2A to FIG. 2D. FIG. 5A to FIG. 5D are schematic cross-sectional views taken along the line V-V' of FIG. 2A to FIG. 2D. FIG. 6A to FIG. 6D are schematic cross-sectional views taken along the line VI-VI' of FIG. 2A to FIG. 2D. FIG. 7A to FIG. 7D are schematic cross-sectional views taken along the line VII-VII' of FIG. 2A to FIG. 2D. FIG. 8A to FIG. 8D are schematic cross-sectional views of the line VIII-VIII' of FIG. 2A to FIG. 2D.

Referring to FIG. 2A to FIG. 7A, a substrate 10 is provided. The substrate 10 can be a semiconductor substrate or a semiconductor compound substrate, such as a silicon-containing substrate or a silicon-germanium substrate. The substrate 10 includes a memory plane region R1 and a periphery region R2.

A first tier TR1 is formed on the substrate 10. First, multiple transistors are formed on a substrate 10. The multiple transistors include first transistors T1 and second transistors T2 in the periphery region R2. The first transistors T1 and the second transistors T2 can be N-type metal oxide semiconductor (NMOS) transistors, P-type metal oxide semiconductor (PMOS) transistors or complementary metal oxide semiconductor (CMOS) devices.

Figure 4A:
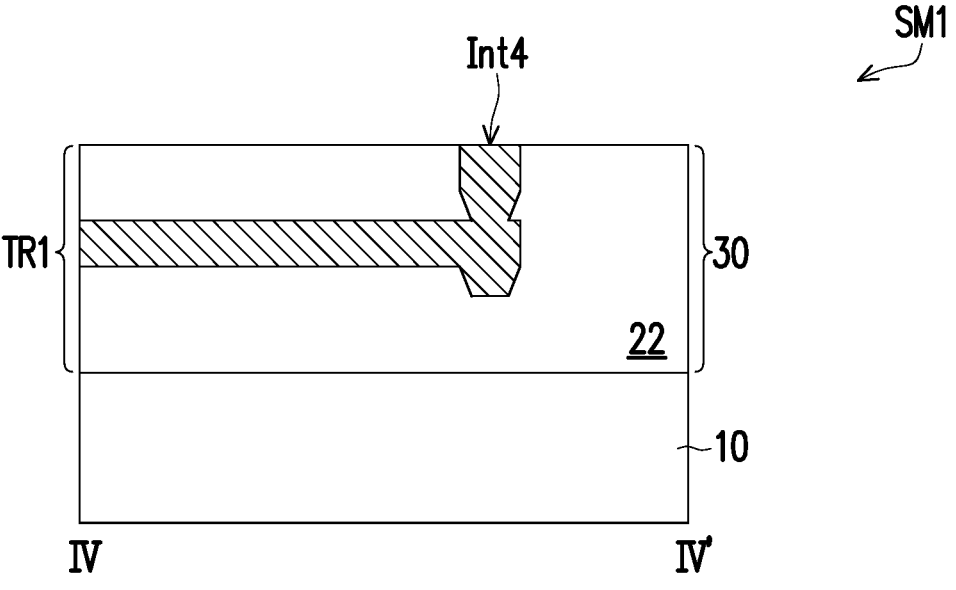
FIG. 4A to FIG. 4D are schematic cross-sectional views taken along the line IV-IV' of FIG. 2A to FIG. 2D.
Figure 4B:
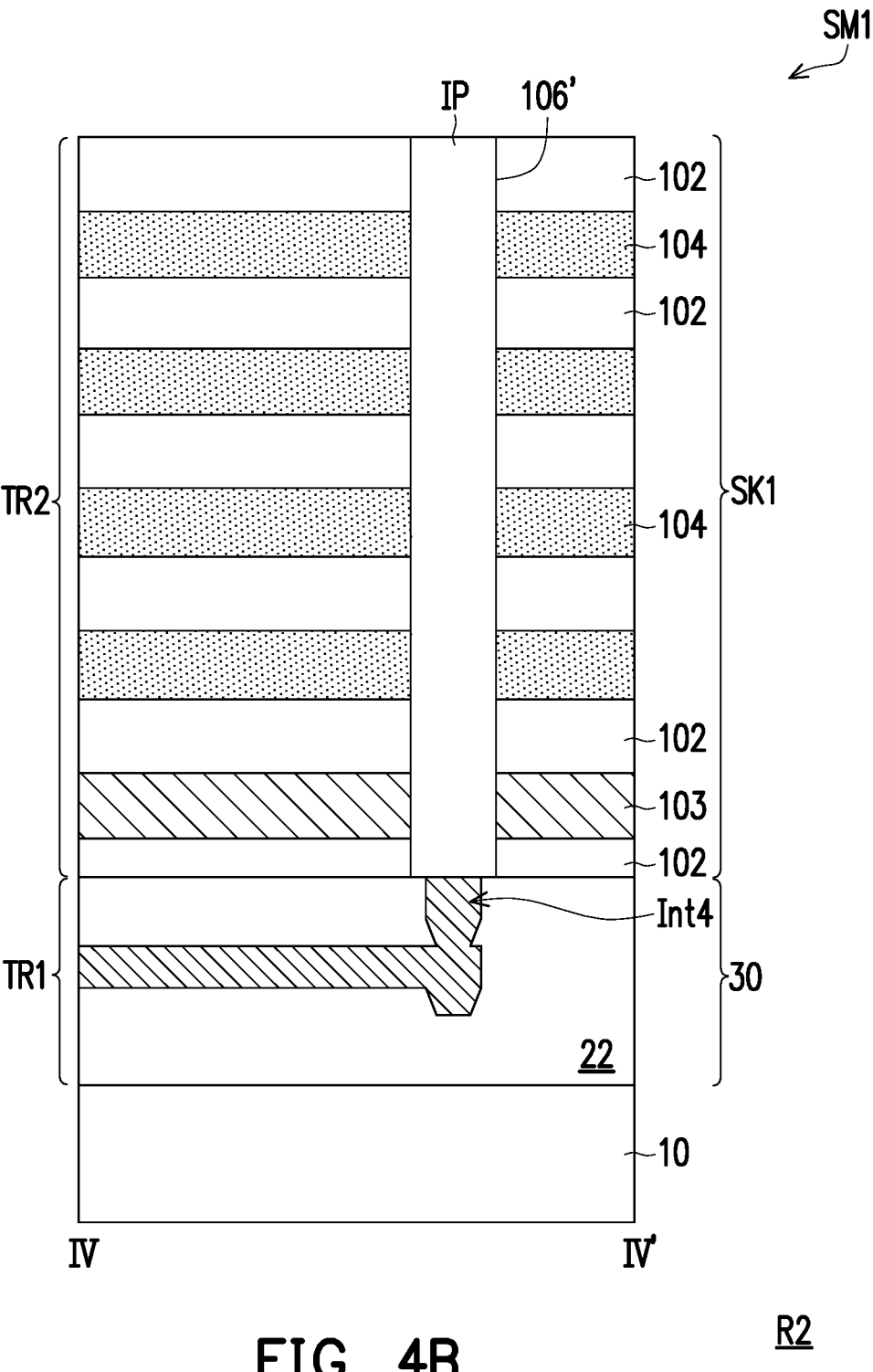

Referring to FIG. 3A and FIG. 4A, next, an interconnect structure 30 is formed on the first transistors T1 and the second transistors T2. The interconnect structure 30 includes multiple dielectric layers 22 and interconnect lines Int1, Int2, Int3, Int4 formed in the multiple dielectric layers 22. The interconnect lines Int1, Int2, Int3, Int4 include multiple plugs (not shown) and multiple wires (not shown) and the like. The interconnect line Int1 is connected to the first terminals E1 of multiple first transistors T1. The interconnect line Int2 is connected to the first terminals E1 of multiple second transistors T2. The interconnect line Int3 is connected to the second terminals E2 of multiple first transistors T1. The interconnect line Int4 is connected to the second terminals E2 of the multiple second transistors T2. The interconnect lines Int1, Int2, Int3, Int4 can be formed by single damascene, dual damascene process or any known method. The interconnect line may include a barrier material and a metal material. In one embodiment, the barrier material includes titanium (Ti), titanium nitride (TiN), tantalum (Ta), tantalum nitride (TaN) or a combination thereof. The metal material includes tungsten (W).

Referring to FIG. 3B to FIG. 7B, a first stacked structure SK1 is formed on the first tier TR1. The first stacked structure SK1 is formed on the interconnect structure 30 in the memory plane region R1 and the periphery region R2. The first stacked structure SK1 includes multiple insulating layers 102 and multiple intermediate layers 104 stacked alternately. In some embodiments, the material of the insulating layers 102 includes silicon oxide, and the material of the intermediate layers 104 includes silicon nitride. The intermediate layers 104 can serve as sacrificial layers, which will be partially removed in subsequent processes. In some embodiments, the first stacked structure SK1 further includes a conductive layer 103. The conductive layer 103 is located on the lowermost insulating layer 102. The conductive layer 103 can serve as an etch stop layer. The conductive layer 103 may include polysilicon.

Referring to FIG. 3B and FIG. 8B, a vertical channel pillar CP is formed in the first stacked structure SK1 of the memory plane region R1 (as shown in FIG. 7B), and an insulating pillar IP is formed in the first stacked structure SK1 of the periphery region R2 (as shown in FIG. 3B, and FIG. 4B and FIG. 5B and FIG. 6B).

Referring to FIG. 7B and FIG. 8B, a vertical channel pillar CP is formed in the first stacked structure SK1 in the memory plane region R1 includes the following steps. First, an opening 106 is formed in the first stacked structure SK1. In one embodiment, the opening 106 may have substantially vertical sidewalls. In another embodiment, opening 106 may have slightly inclined sidewalls (not shown). In one embodiment, the opening 106 is also called a vertical channel (VC) hole. In one embodiment, the opening 106 can be formed by single-stage lithography and etching processes. In another embodiment, the opening 106 is formed by multi-stage e lithography and etching processes. The profile of the sidewall of the opening 106 formed by multi-stage lithography and etching processes may be bamboo-shaped.

A charge storage structure 108 is then formed in the opening 106. The charge storage structure 108 is in contact with the insulating layers 102 and the intermediate layers 104. In one embodiment, the charge storage structure 108 is an oxide/nitride/oxide (ONO) composite layer. The charge storage structure 108 may be a conformal layer formed on the sidewall and the bottom surface of the opening 106. Thereafter, a vertical channel pillar CP is formed in the remaining space of the opening 106. The vertical channel pillar CP can be formed by the following steps.

A channel layer 110 is formed on the inner sidewall and the bottom surface of the charge storage structure 108. In one embodiment, the material of the channel layer 110 includes undoped polysilicon. Next, an insulating pillar (or called a core insulating pillar) 112 is formed on the inner surface of the channel layer 110. In one embodiment, the material of the insulating pillar 112 includes silicon oxide. Afterwards, a channel plug 114 is formed in the opening 106, and the channel plug 114 is in contact with the channel layer 110. The channel plug 114 extends from the top surface (not shown) of the uppermost insulating layer 102 to a certain depth of the opening 106. In one embodiment, the material of the channel plug 114 includes doped semiconductor material, such as doped polysilicon. The channel layer 110, the insulating pillar 112 and the channel plug 114 may be collectively referred to as a vertical channel pillar CP. The vertical channel pillar CP penetrates through the stacked structure SK1 and extends to the conductive layer 103. The charge storage structure 108 surrounds the vertical outer surface of the vertical channel pillar CP.

Referring to FIG. 3B to FIG. 6B, an insulating pillar IP is formed in the first stacked structure SK1 in the periphery region R2 includes the following steps. First, an opening 106' is formed in the first stacked structure SK1 in the periphery region R2. In one embodiment, the opening 106' may have substantially vertical sidewalls. In another embodiment, the opening 106' may have slightly inclined sidewalls (not shown). The opening 106' may be formed simultaneously with, formed before, or formed after the opening 106. The opening 106' can be formed by single-stage lithography and etching processes. In another embodiment, the opening 106' is formed by multi-stage lithography and etching processes. The profile of the sidewall of the opening 106' formed by multi-stage lithography and etching processes may be bamboo-shaped. Afterwards, an insulating material is formed on the first stacked structure SK1 and in the opening 106', and then, a chemical mechanical polishing process or an etch-back process is performed to remove excess insulating material to form an insulating pillar IP.

Referring to FIG. 3C and FIG. 4C to FIG. 7C, a dielectric layer 115 is formed on the substrate 10 in the memory plane region R1 and the periphery region R2. The material of the dielectric layer 115 includes silicon oxide. Next, the multiple intermediate layers 104 of the first stacked structure SK1 in the memory plane region R1 are replaced with multiple conductive layers 126 (shown in FIG. 7C and FIG. 8C), and the intermediate layers 104 of the first stacked structure SK1 in the periphery region R2 remain (shown in FIG. 3C and FIG. 4C and FIG. 5C and FIG. 6C).

Referring to FIG. 7B and FIG. 7C, the method of replacing the multiple intermediate layers 104 of the first stacked structure SK1 in the memory plane region R1 with multiple conductive layers 126 includes the following steps. First, a patterning process is performed on the first stacked structure SK1 in the memory plane region R1 to form one or more separation trenches. The separation trench extends through the dielectric layer 115 and the first stacked structure SK1, so that the intermediate layers 104 and the insulating layers 102 are exposed. The separation trench may have vertical sidewalls (not shown) or slightly sloped sidewalls (not shown).

Figure 4C:
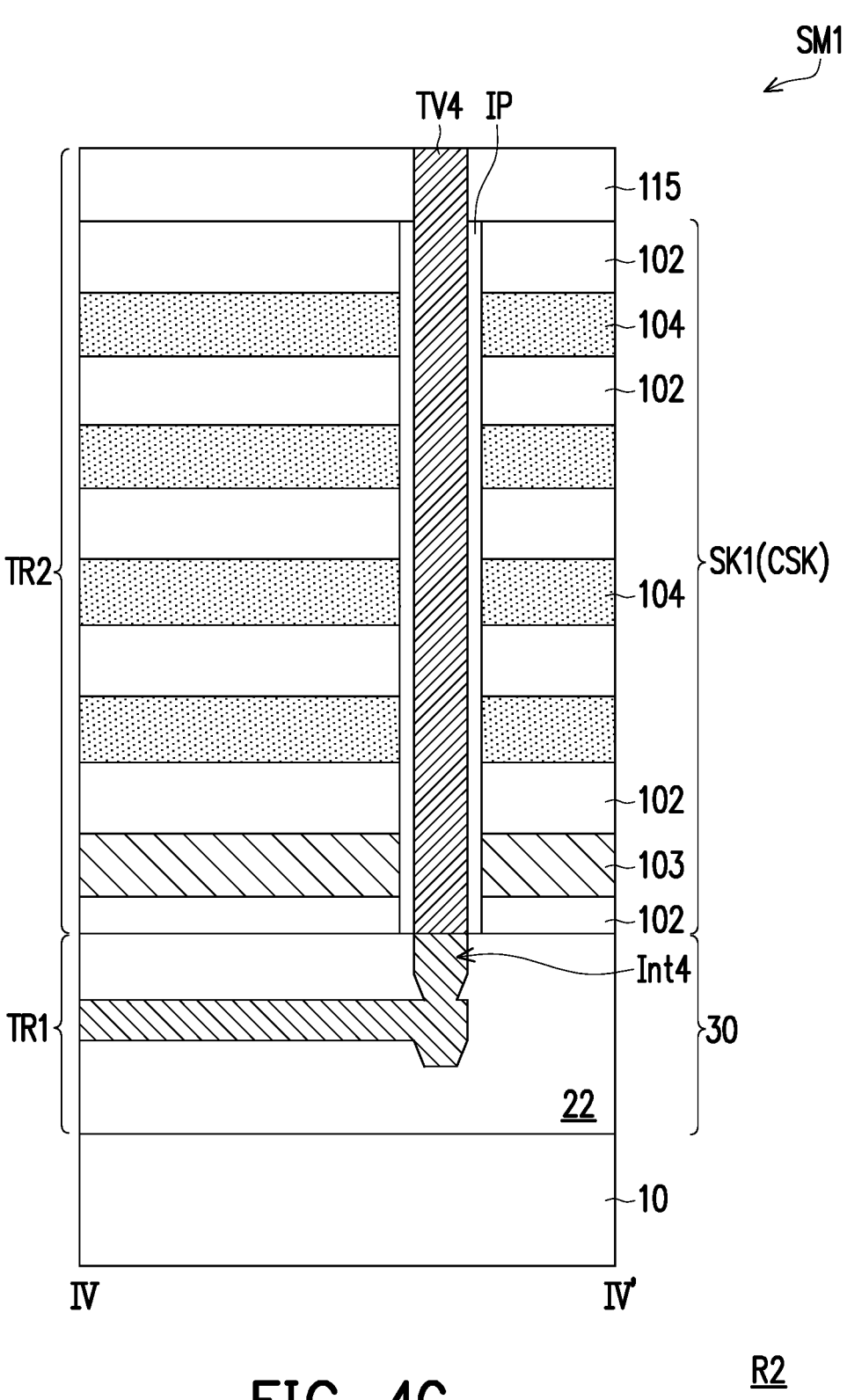
Figure 4D:
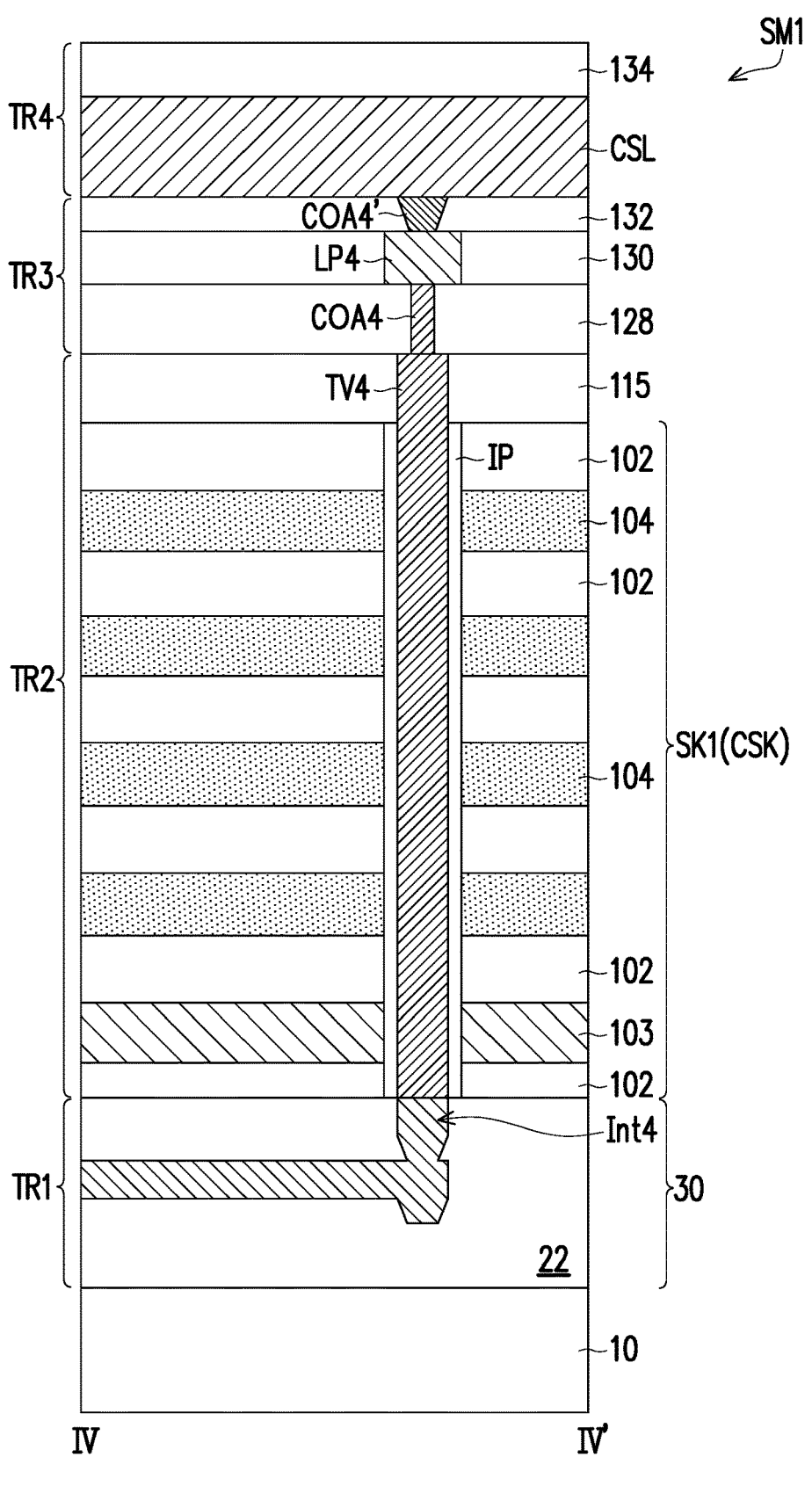

Next, a selective etching process is performed to make the etchant contact the intermediate layers 104 of the first stacked structure SK1 at both sides through the separation trench. Thereby, portions the intermediate layers 104 are removed to form multiple horizontal openings (not shown), portions of the intermediate layers 104 remain in the periphery region R2, as shown in FIG. 3C and FIG. 4C and FIG. 4C. The selective etching process can be an isotropic etching process, such as a wet etching process. The etchant used in the wet etching process may include hot phosphoric acid. Then, a conductive layer 126 is formed in the separation trench and each horizontal opening, as shown in FIG. 7C. The conductive layers 126 can serve as gate layers. The conductive layer 126 may include a barrier layer and a metal layer. In one embodiment, the material of the barrier layer includes titanium (Ti), titanium nitride (TiN), tantalum (Ta), tantalum nitride (TaN) or a combination thereof. The material of the metal layer includes tungsten (W). Portions of the intermediate layers 104 in the memory plane region R1 are replaced by conductive layers 126, and portions of the intermediate layers 104 remain in the periphery region R2 (shown in FIG. 3C and FIG. 4C and FIG. 5C and FIG. 6C). The multiple insulating layers 102 and the multiple conductive layers 126 form a second stacked structure SK2. The second stacked structure SK2 in the memory plane region R1 and the first stacked structure SK1 remaining in the periphery region R2 together form a composite stacked structure CSK.

Referring to FIG. 3C and FIG. 4C to FIG. 5C and FIG. 6C, through vias TV1, TV2, TV3 and TV4 are formed in the dielectric layer 115 and the insulating pillar IP in the periphery region R2. The through vias TV1 and TV2 are respectively connected to interconnect lines Int1 and Int2. The through vias TV3 and TV4 are respectively connected to interconnect lines Int3 and Int4.

The method of forming the through vias TV1, TV2, TV3, TV4 is described in the following steps, for example. First, lithography and etching processes are performed to form openings (not shown) in the insulating pillars IP. A conductive material is then formed over the dielectric layer 115 and in the openings. Afterwards, a chemical mechanical polishing process or an etch-back process is performed to remove excess conductive material on the dielectric layer 115. The conductive material includes a barrier material and a metal material. In one embodiment, the barrier material includes titanium (Ti), titanium nitride (TiN), tantalum (Ta), tantalum nitride (TaN) or a combination thereof. The metal material includes tungsten (W). So far, the dielectric layer 115, the composite stacked structure CSK and the through vias TV1, TV2, TV3, TV4 form a second tier TR2.

Referring to FIG. 3D to FIG. 8D, a third tier TR3 is formed on the second tier TR2. The third tier TR3 may include dielectric layers 128, 130, contacts COA1 to COA6, local bit lines LBL, local source lines LSL, and connection pads LP3 and LP4. A dielectric layer 128 is formed on the dielectric layer 115. A dielectric layer 130 is formed on dielectric layer 128. The dielectric layers 128, 130 may include silicon oxide.

The contacts COA1 to COA4 are formed in the dielectric layer 128 and are electrically connected to the through vias TV1 to TV4 respectively. The contacts COA5 and COA6 are formed in the dielectric layers 128 and 115 and are electrically connected to the channel pillar CP.

The local bit line LBL is formed in the dielectric layer 130 and is electrically connected to the contact COA1. The local source line LSL is formed in the dielectric layer 130 and electrically connected to the contact COA2. The connection pad LP3 is formed in the dielectric layer 130 and is electrically connected to the contact COA3. The connection pad LP4 is formed in the dielectric layer 130 and is electrically connected to the contact COA4. The connection pads LP3 and LP4 can be formed simultaneously when forming the local bit line LBL and the local source line LSL. The contacts COA1 to COA6, the local bit lines LBL, the local source lines LSL, the connection pads LP3 and LP4 can be formed by single damascene or dual damascene processes, or any known method, and will not be described in detail herein.

Referring to FIG. 3D and FIG. 4D to FIG. 7D, a fourth tier TR4 is formed on the third tier TR3. The fourth tier TR4 may include a dielectric layer 132, contacts COA3' and COA4', a global bit line GBL, a common source line CSL and a protection layer 134. The dielectric layer 132 is formed on the dielectric layer 130. The dielectric layer 132 may include silicon oxide. The contacts COA3', COA4' are formed in the dielectric layer 132 and are electrically connected to the connection pads LP3, LP4 respectively. The global bit line GBL and the common source line CSL are formed on the dielectric layer 132 and electrically connected to the contacts COA3' and COA4' respectively. The contacts COA3', COA4', the global bit line GBL, and the common source line CSL can be formed by, for example, single damascene or dual damascene process, or any known method, and will not be described in detail herein. The protection layer 134 may include silicon oxide, silicon nitride or a combination thereof. So far, the fabrication of the memory device SM1 is completed.

The transistors in the above embodiments may be complementary metal-oxide-semiconductor (CMOS) devices. Since the transistors are formed under the memory array, this architecture can also be called a complementary metal-oxide-semiconductor device under the memory array (CMOS-Under-Array, CUA) structure. However, the present disclosure is not limited thereto. In other embodiments, the complementary metal-oxide-semiconductor device (CMOS) can also be bonded together with the memory array, so this architecture can also be called a bonded complementary metal-oxide-semiconductor device bonded memory array (CMOS-Bonded-Array, CbA) structure.

The embodiments of the present disclosure may be applied to a 3D NOR flash memory and a 3D AND flash memory.

To sum up, the embodiment of the present disclosure uses a common source line to save space. Therefore, the spacing between the common source line (CSL) and the global bit lines (GBL) at the same tier can be increased. Due to the common source line design, the wider pitch and less wiring are provided for the back end of line (BEOL) process, so as to reduce the CSL/GBL short rate.

What is claimed is:

1. A memory device, comprising:
a substrate;
a first tier, located on the substrate, and comprising a plurality of first transistors and a plurality of second transistors, wherein the plurality of first transistors comprise a plurality of groups;
a second tier, located on the first tier, and comprising a composite stacked structure, wherein the composite stacked structure comprises a first stacked structure and a second stacked structure;
a third tier, located on the second tier, and comprising:
a plurality of local bit lines, wherein each of the plurality of local bit lines is connected to a first terminal of one of the plurality of first transistors; and
a plurality of local source lines, wherein each of the plurality of local source lines is connected to a first terminal of one of the plurality of second transistors;
a fourth tier, located on the third tier, and comprising:
a plurality of global bit lines, wherein each of the global bit lines is connected to a plurality of second terminals of the plurality of first transistors in one of the plurality of groups; and
a common source line, connected to a second terminal of each of the plurality of second transistors;
a plurality of first through vias, extending through the first stacked structure, wherein a first terminal of each of the plurality of local bit lines is electrically connected to the first terminal of one of the plurality of first transistors through one of the plurality of first through vias; and
a second through via, extending through the first stacked structure, wherein a first terminal of each of the plurality of local source lines is electrically connected to the first terminal of one of the plurality of second transistors through the second through via,
wherein the first terminal of each of the plurality of local bit lines and the first terminal of each of the plurality of local source lines are on the same side.

2. The memory device of claim 1, wherein at the fourth tier, a number of the common source line is less than a number of the plurality of global bit lines.

3. The memory device of claim 1, further comprising:
a plurality of third through vias, extending through the first stacked structure, wherein each of the global bit lines is electrically connected to the plurality of second terminals of the plurality of first transistors in one of the plurality of groups through one of the plurality of third vias; and
a fourth through via, extending through the first stacked structure, wherein the common source line is electrically connected to the second terminal of each of the plurality of second transistors through the fourth through via.

4. The memory device of claim 3, wherein the first tier further comprises:
an interconnect structure, comprising:
a first interconnect line, connected to the plurality of third through vias and the plurality of first transistors; and
a second interconnect line, connected to the fourth through via and the plurality of second transistors.

5. The memory device of claim 3, wherein a number of the fourth through via is less than a number of the plurality of third through via.

6. The memory device of claim 1, wherein a number of the plurality of local bit lines is the same as a number of the plurality of local source lines.

7. The memory device of claim 1, wherein the plurality of local bit lines and the plurality of local source lines are arranged alternately.

8. The memory device of claim 1, wherein a number of the plurality of first transistors is the same as a number of the plurality of second transistors.

9. The memory device of claim 1, further comprising:
a plurality of channel pillars, extending through the second stacked structure and respectively connected to the plurality of local bit lines and the plurality of local source lines; and
a plurality of charge storage structures, located between the plurality of channel pillars and the second stacked structure.

10. The memory device of claim 1, wherein
the first stacked structure comprises a plurality of first insulating layers and a plurality of intermediate layers stacked alternately; and
the second stacked structure comprises a plurality of second insulating layers and a plurality of conductive layers stacked alternately.

11. A memory device, comprising:
a plurality of first transistors, divided into a plurality of groups;
a plurality of local bit lines, wherein a first terminal of each of the plurality of local bit lines is electrically connected to a first terminal of one of the plurality of first transistors through a first through via;
a plurality of global bit lines, wherein each of the plurality of global bit lines is electrically connected to a plurality of second terminals of the plurality of first transistors in one of the plurality of groups;
a plurality of second transistors;
a plurality of local source lines, wherein a first terminal of each of the plurality of local source lines is connected to a first terminal of one of the plurality of second transistors through a second through via; and
a common source line, connected to a second terminal of each of the plurality of second transistors,
wherein the first terminal of each of the plurality of local bit lines and the first terminal of each of the plurality of local source lines are on the same side.

12. The memory device of claim 11, wherein the common source line and the plurality of global bit lines are at the same tier.

13. The memory device of claim 11, wherein a number of common source line is less than a number of the plurality of global bit lines.

14. The memory device of claim 11, wherein a number of the plurality of second transistors connected to the common source line is greater than a number of the plurality of first transistors connected to each of the plurality of global bit lines.

15. The memory device of claim 11, further comprising a memory array located between a substrate and the plurality of local bit lines and between the substrate and the plurality of local sources line.

16. The memory device of claim 15, wherein the plurality of first transistors and the plurality of second transistors are arranged between the memory array and the substrate.

* * * * *